United States Patent [19]
Tanaka et al.

[11] Patent Number: 5,737,237
[45] Date of Patent: Apr. 7, 1998

[54] METHOD AND APPARATUS FOR DATA PATH CIRCUIT LAYOUT DESIGN AND MEMORY MEDIUM FOR CAUSING COMPUTER TO EXECUTE DATA PATH CIRCUIT LAYOUT DESIGN

[75] Inventors: Yasuhiro Tanaka; Hiroshi Mizuno; Shinichi Kumashiro, all of Osaka, Japan

[73] Assignee: Matsushita Electric Industrial Co., Ltd., Osaka, Japan

[21] Appl. No.: 602,315

[22] Filed: Feb. 16, 1996

[30] Foreign Application Priority Data

Feb. 17, 1995 [JP] Japan .................... 7-029071

[51] Int. Cl.$^6$ ................................ G06F 17/50
[52] U.S. Cl. ........................... 364/491; 364/488
[58] Field of Search ....................... 364/488, 489, 364/490, 491

[56] References Cited

U.S. PATENT DOCUMENTS

| | | | |
|---|---|---|---|
| 4,815,003 | 3/1989 | Putatunda et al. | 364/491 |
| 5,384,710 | 1/1995 | Lam et al. | 364/489 |
| 5,491,640 | 2/1996 | Sharma et al. | 364/488 |
| 5,519,628 | 5/1996 | Russell et al. | 364/489 |
| 5,555,201 | 9/1996 | Dangelo et al. | 364/489 |
| 5,623,417 | 4/1997 | Iwasaki et al. | 364/488 |
| 5,625,564 | 4/1997 | Rogoyski | 364/488 |
| 5,640,328 | 6/1997 | Lam | 364/489 |

FOREIGN PATENT DOCUMENTS 5-250439  9/1993  Japan .

OTHER PUBLICATIONS

H. Cai et al., "A Data Path Layout Assembler for High Performance DSP Circuits", 1990, Proceeding of 27th ACM/IEEE Design Automation Conference pp. 306–311, Abstract of this document is described on p. 3 of the Specification.

T. Sakai et al., "Functional Building Block Placement Algorithms for Data–Path Layout", 1992, Research Report of Design Automation Study Group, Information Process Society of Japan, 64–7, pp. 49–56, Abstract of this document is described on p. 3 of the Specification.

H. Nakao et al., "A High Density Layout Generation Method for Datapath Compiler", 1992, Research Report of Design Automation Study Group, Information Process Society of Japan, 63–2, pp. 9–16, Abstract of this document is described on p. 4 of the Specification.

H. Nakao et al., "A High Density Datapath Layout Generation Method Under Path Delay Constraints", 1993, Proceeding of the IEEE 1993 Custom Integrated Circuits Conference, pp. 9.5.1–9.5.5, Abstract of this document is described on p. 4 of the Specification.

*Primary Examiner*—Kevin J. Teska
*Assistant Examiner*—Leigh Marie Garbowski
*Attorney, Agent, or Firm*—McDermott, Will & Emery

[57] ABSTRACT

The present invention provides a data path circuit layout design method capable of generating a mask layout which satisfies timing specifications and given contour conditions, and which is reduced in circuit area.

There are prepared function macros in each of which there is defined an expansion, according to the parameters, to a circuit comprising a plurality of schematic leaf cells. For a data path circuit of which function blocks are described by function macros, the placement of the function blocks is optimized by a function macro placement process. By a function macro expansion process, the function macros describing the function blocks are expanded and connection information on the schematic leaf cell level are prepared. By a detail placement and routing process, the schematic leaf cells are replaced with the corresponding layout leaf cells and the layout leaf cells are wired to one another, thereby to generate a mask layout of the data path circuit.

21 Claims, 22 Drawing Sheets

F I G. 17
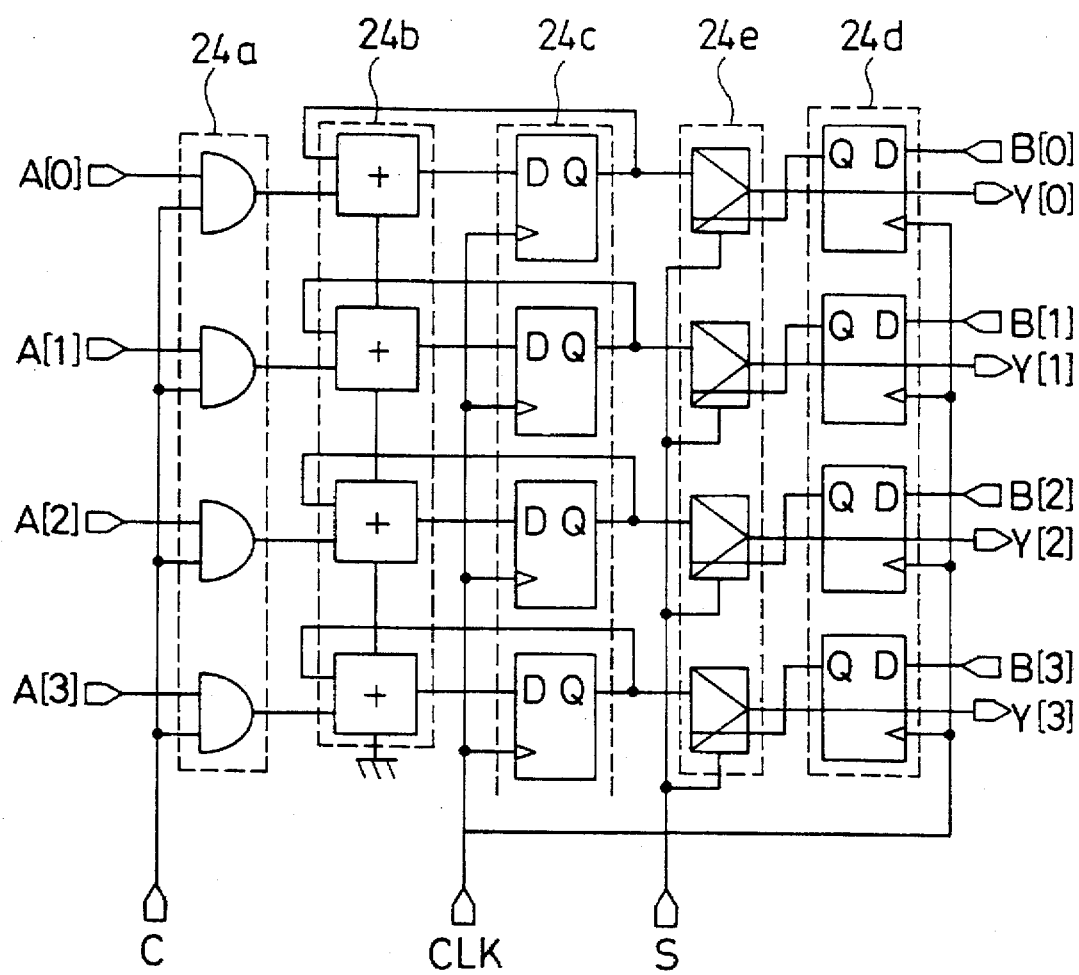

FIG.20

CONTROL SIGNAL DIRECTION

DATA SIGNAL DIRECTION

METHOD AND APPARATUS FOR DATA PATH CIRCUIT LAYOUT DESIGN AND MEMORY MEDIUM FOR CAUSING COMPUTER TO EXECUTE DATA PATH CIRCUIT LAYOUT DESIGN

[BACKGROUND OF THE INVENTION]

The present invention relates to a method of designing the layout of a data path circuit forming a semiconductor integrated circuit.

A data path circuit is arranged to process data each having a certain bit width, and has regularity in arrangement. In a data path circuit layout design, such regularity is utilized to arrange, in the form of a grid, cells serving as unit operational circuits which are called leaf cells or bit slices, such that a mask layout is prepared.

Figure 20:
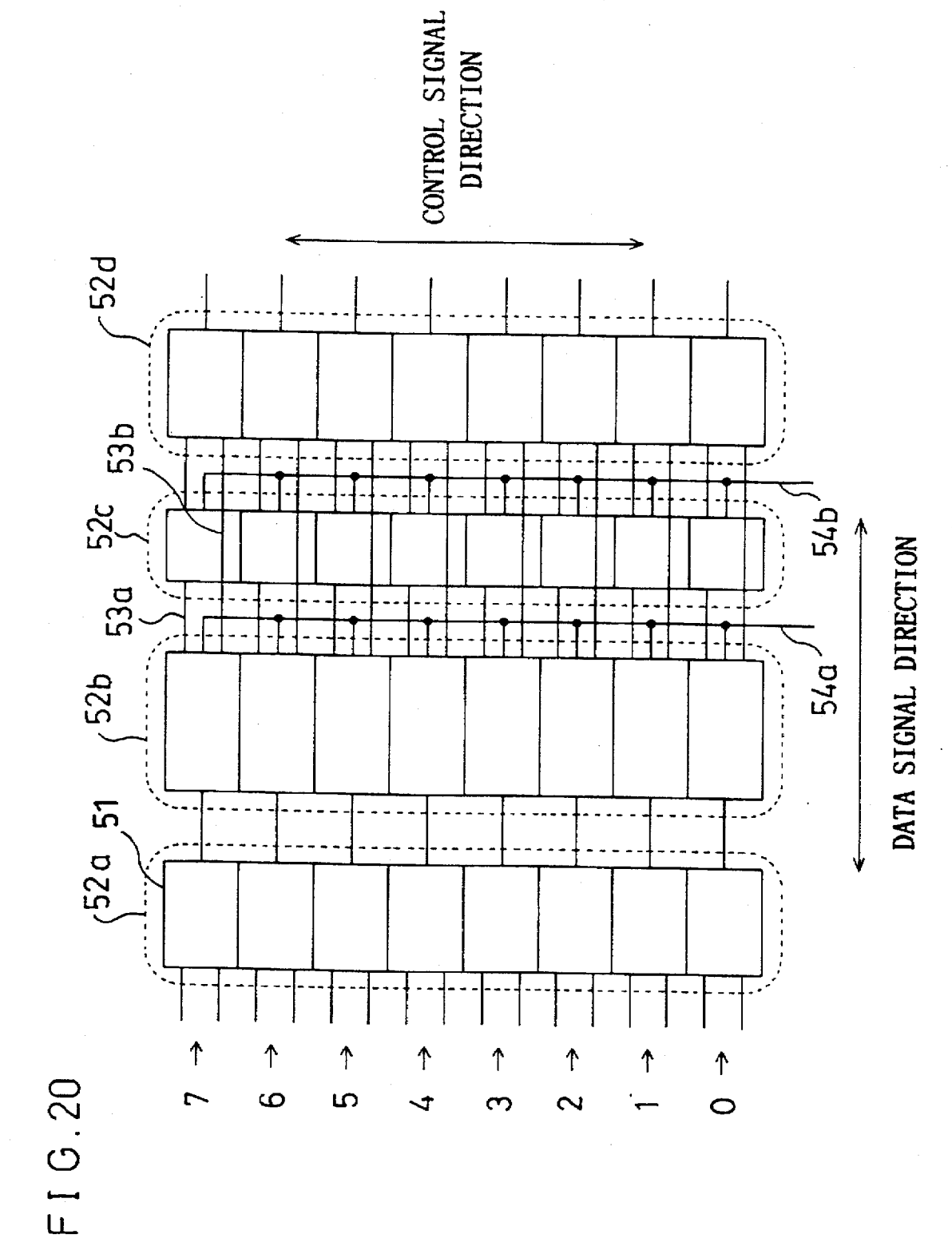

FIG. 20 shows an example of a data path circuit layout. Shown in FIG. 20 are leaf cells 51, function blocks 52a, 52b, 52c, 52d, data signal lines 58a, 58b, and control signal lines 54a, 54b. In FIG. 20, the data signals are transmitted in the horizontal direction, while the control signals are transmitted in the vertical direction. In each block of the data path circuit, the size in the data signal transmitting direction is called length, while the size in the control signal transmitting direction is called width.

In the data path circuit shown in FIG. 20, 8-bit data are to be processed and each function block comprises eight leaf cells respectively corresponding to the bits of a data signal.

Function blocks are connected to one another by data signal lines. For example, the data signal line 53a connects the function blocks 52b, 52c to each other, and the data signal line 53b connects the function blocks 52b, 52d to each other. A control signal line is to be used for wiring the leaf cells of the same function block. The control signal line 54a is used for wiring the leaf cells of the function block 52b, and the control signal line 54b is used for wiring the leaf cells of the function block 52c.

The data signal line 53b passes on a leaf cell of the function block 52c. A routing track (also called feed) is provided in a vacant zone of a leaf cell. A signal line generally passes through a routing track. When the number of available routing tracks is smaller than the number of signal lines passing through a function block, it is called "overflow of routing track". In the case of overflow of routing track, it is required to form, between leaf cells, a zone through which a signal line passes.

As data path circuit layout design, custom design has conventionally been manually made. Recent progress in semiconductor technology has caused a data path circuit to be made in a larger scale, to be arranged in a more complicated manner and to be operated at a higher speed. Also, there is increased the need to design a data path circuit in a shorter period of time. Accordingly, layout design using a calculator has recently been made extensively.

There have already been proposed some examples of the data path circuit layout design method using a calculator.

For example, the following method is disclosed by a document 1: H. Cai et al., "A Data Path Layout Assemble for High Performance DSP Circuits" (Proceeding of 27th ACM/IEEE Design Automation Conference, pp 306–811, 1990). There are used, in an objective function (cost function), the total wiring length of the data signal lines and the number of overflows of routing track, and the function blocks are so arranged as to minimize the value of such objective function. To minimize the total wiring length, the connected function blocks are arranged in more close vicinity to one another to minimize the signal delay time. To minimize the number of overflows of routing track, the data signal lines are installed on leaf cells as much as possible. This restrains the wiring zone from being increased in area, enabling the entire data path circuit to be reduced in area.

The following method is disclosed by a document 2: Toshitika SAKAI et al., "Functional Building Block Placement Algorithms for Data-Path Layout" (Research Report of Design Automation Study Group, Information Process Society of Japan, 64-7, pp. 49–56, 1992). A set of the function blocks is divided into clusters. As in the document 1, there are used, in an objective function, the total wiring length of the data signal lines and the number of overflows of routing track. Thus, the function blocks per cluster are placed to minimize the value of the objective function. The function blocks are divided into clusters for shortening the calculating period of time. There is also disclosed a method of two-dimensionally placing the function blocks, instead of the linear placement.

The following method is disclosed by a document 3: Hiroomi NAKAO et al., "A High Density Layout Generation Method for Datapath Compiler" (Research Report of Design Automation Study Group, Information Process Society of Japan, 63-2, pp. 9–16, 1992). According to the number of the data signal lines passing on a leaf cell, the leaf cell is extended in size and a routing track is embedded in such an extended portion of the leaf cell. Such leaf cells are placed using an array compiler to obtain the desired data path circuit layout.

The following method is disclosed by a document 4: H. NAKAO et al., "A High Density Datapath Layout Generation Method under Path Delay Constraints" (Proceeding of IEEE 1993 Custom Integrated Circuits Conference, pp. 9.5.1–9.5.5, 1993). Added to the method disclosed in the document 3 is a method in which there are used, in an objective function, the number of overflows of routing track and signal delay constrains in a timing-constrained path, and in which the function blocks are so placed as to minimize the value of the objective function. According to this method, the placement of the function blocks is optimized with the signal delay constraints taken under consideration. It is therefore possible to obtain a layout where the delay time of a data signal to which timing constraints have been given, is reduced to a predetermined delay constraint value or less.

However, the data path circuit layout design methods of prior art present the following disadvantages.

When the placement of the function blocks is optimized the use, in the objective function, of the number of overflows of routing track and the total wiring length of the data signal lines as done in the method disclosed by each of the documents 1 and 2, the average signal delay time can be minimized. However, there are instances where the timing specifications of a specific signal line are not satisfied. If there is even a single signal line of which timing specifications are not satisfied, the entire circuit cannot properly be operated. Accordingly, provision has conventionally been made such that a circuit operable at a speed sufficiently high with respect to the required operational speed is designed by using leaf cells of which transistors are sufficiently large in size. However, when the transistor sizes are large, the leaf cells are also large in area. This results in an increase in the area of the data path circuit in its entirety.

When the placement of the function blocks is optimized with the use, in the objective function, of the number of overflows of routing track and the signal delay constraints as done in the method disclosed by the document 4, the delay constraints are satisfied since the function blocks are placed in the vicinity of one another for the circuit portion to which the signal delay constraints have been given. However, there is a possibility of the total wiring length of the circuit being rather increased since only a portion of the signal lines is optimized. As a result, there is increased the delay time of other circuit portion to which no signal delay constraints have been given. Further, a routing track cannot be assigned in a straight line for a specific wiring line such that the routing track is required to be transferred to another routing track. This results in an increase in the area of the data path circuit in its entirety. Thus, each of the data path circuit layout design methods of prior art is disadvantageous in that it is difficult to prepare a layout in which the area of a circuit is generally reduced, yet satisfying the timing specifications.

In each of the data path circuit layout design methods of prior art, the placement of the function blocks is optimized in order to reduce the circuit area and to satisfy the timing specifications. At this time, the signal line drive ability of each function block is previously determined. Accordingly, the timing specifications cannot always be satisfied only by optimizing the placement of the function blocks. On the other hand, to securely satisfy the timing specifications at all times, the circuit is formed by function blocks each having a rather great drive ability. This disadvantageously results in an increase in circuit area.

In each of the data path circuit layout design methods of prior art, there are used leaf cells having the same length in the direction at a right angle to the data signal transmitting direction. Accordingly, when the data path circuit has a portion where the bit width undergoes a change, a vacant zone containing no leaf cell is wastefully formed in a function block of which bit width is small. This is because the sizes of the circuit block are determined according to the function block of which bit width is the greatest. This disadvantageously increases the circuit area.

As shown by each of the documents 3 and 4, a leaf cell may be extended in size and a routing track may be embedded in such an extended portion. However, this is substantially equivalent to an increase in wiring zone since the extended portion contains no transistor. Accordingly, a wasteful zone is apparently eliminated, but the circuit area cannot be reduced.

In each of the data path circuit layout design methods of prior art, the number of operations is increased since the layout is prepared by placing the function blocks in line in the data signal transmitting direction. Further, for a data path circuit comprising a number of function blocks, the resulting layout becomes slender. This disadvantageously makes it difficult to form an optimum floor plan in the layout of a chip in its entirety.

As disclosed in the document 2, the function blocks may be two-dimensionally disposed. However, when the bit widths of the function blocks are not even, it is difficult to make the layout width constant. Thus, there are instances where two-dimensional placement rather produces wasteful vacant zones to increase the circuit area.

[SUMMARY OF THE INVENTION]

It is an object of the present invention to provide a data path circuit layout design method capable of preparing a layout which is reduced in circuit area as compared with a layout of prior art, and which can securely satisfy given timing specifications and given circuit block contour conditions.

To achieve the object above-mentioned, the present invention provides a data path circuit layout design method of generating a mask layout of a data path circuit comprising a plurality of function blocks, and this data path circuit layout design method is characterized in that there are prepared (i) function macros in each of which there is defined an expansion, according to the parameters, to a circuit comprising a plurality of schematic leaf cells and (ii) layout leaf cells corresponding to the schematic leaf cells, and this data path circuit layout design method comprises: a function macro placement process for determining, for a data path circuit of which function blocks are described by function macros, the placement of the function blocks so as to optimize the value of a predetermined objective function; a function macro expansion process for expanding each of the function macros describing the function blocks, to a circuit comprising a plurality of schematic leaf cells and for preparing connection information on the schematic leaf cell level; and a detail placement and routing process for generating a mask layout by replacing the schematic leaf cells with the corresponding layout leaf cells and for wiring the layout leaf cells to one another, the replacing and wiring being made based on the placement of the function blocks determined by the function macro placement process and on the connection information on the schematic leaf cell level prepared by the function macro expansion process.

According to the arrangement above-mentioned, for a data path circuit comprising function blocks described by function macros, the placement of the function blocks is determined by the function macro placement process such that the value of the predetermined objective function is optimized. Then, connection information on the schematic leaf cell level is prepared by the function macro expansion process. Then, based on the function block placement and the connection information on the schematic leaf cell level, the schematic leaf cells are replaced with the corresponding layout leaf cells and the layout leaf cells are wired by the detail placement and routing process. Thus, a data path circuit mask layout can be generated.

The data path circuit layout design method may comprise, after the function macro placement process, a drive ability optimization process arranged such that the signal delay time of each signal line between function blocks is obtained, and that when there is a signal line which does not satisfy the signal delay constraints, there is changed the output drive ability specifying parameter of the function macro describing the function block at the output side of the signal line.

According to such an arrangement, the schematic leaf cell drive ability for driving the data signal line is optimized. Thus, there are used layout leaf cells of which drive ability is a required minimum within the range in which the required timing specifications are satisfied. Accordingly, there can be generated a data path circuit mask layout which satisfies the timing specifications and which is reduced in circuit area.

Preferably, the function macro expansion process has a process for selecting one layout leaf cell for each schematic leaf cell such that data path circuit outer conditions are satisfied.

In such an arrangement, there can be generated a data path circuit mask layout which satisfies given contour conditions.

Preferably, the data path circuit layout design method has, after the function macro expansion process, a cell placement improvement process for exchanging the placement of the schematic leaf cells such that the value of the predetermined objective function is optimized.

In such an arrangement, the placement of the schematic leaf cells is so exchanged as to optimize the value of the predetermined objective function. Thus, there can securely be generated a data path circuit mask layout which satisfy the timing specifications and the contour conditions and which is reduced in circuit area.

Preferably, the data path circuit layout design method has, after the function macro expansion process, a cell regeneration process for generating, based on the connection information on the schematic leaf cell level prepared by the function macro expansion process, layout leaf cells having such shapes as to satisfying the contour conditions.

In such an arrangement, based on the connection information on the schematic leaf cell level prepared by the function macro expansion process, layout leaf cells are generated such that the data path circuit contour conditions are satisfied. For example, there are generated layout leaf cells each having a short length and a wide width for a function block of which bit width is small, and layout leaf cells each having a long length and a narrow width for a function block of which bit width is great. Thus, there can more securely be generated a data path circuit mask layout which satisfies the contour conditions.

Further, to achieve the object above-mentioned, the present invention provides a data path circuit layout design method of generating a mask layout of a data path circuit of which specifications are described in a function description language, and this data path circuit layout design method is characterized in that there are prepared a plurality of schematic leaf cells and layout leaf cells corresponding to the schematic leaf cells, and this data path circuit layout design method comprises: a logic synthesis process for generating a circuit comprising schematic leaf cells by logic synthesis and for preparing connection information on the schematic leaf cell level, such generation and preparation being based on the specifications described in the function description language; a regularity extraction process for collecting, in the circuit comprising schematic leaf cells generated by the logic synthesis process, a plurality of schematic leaf cells having a common nature, into one function block such that there is generated a circuit comprising a plurality of such function blocks; a function block placement process for determining, in the circuit comprising a plurality of function blocks generated by the regularity extraction process, the placement of the function blocks such that the value of a predetermined objective function is optimized; and a detail placement and routing process for generating a mask layout by replacing the schematic leaf cells with the corresponding layout leaf cells and by wiring the layout leaf cells to one another, such replacing and wiring being made based on the connection information on the schematic leaf cell level prepared by the logic synthesis process and on the function block placement determined by the function block placement process.

According to the arrangement above-mentioned, a data path circuit of which specifications are described in a function description language, is subjected to logic synthesis based on the specifications described in a function description language by the logic synthesis process. Thus, a circuit comprising schematic leaf cells is generated. Then, in the circuit comprising schematic leaf cells, a plurality of schematic leaf cells having a common nature are collected into one function block to generate a circuit comprising such function blocks by the regularity extraction process. In the function block placement process, the placement of the function blocks is determined such that the value of the predetermined objective function is optimized. Finally, in the detail placement and routing process, the schematic leaf cells are replaced with the corresponding layout leaf cells and the layout leaf cells are wired to one another based on the function block placement and the connection information on the schematic leaf cell level. Thus, a data path circuit mask layout can be generated.

Preferably, there is provided, after the function block placement process, a drive ability optimization process arranged such that the signal delay time of each signal line between function blocks is obtained, and that when there is a signal line which does not satisfy the signal delay constraints, there is changed the output drive ability of the schematic leaf cells in the function block at the output side of this signal line.

This optimizes the schematic leaf cell drive ability for driving the data signal line. Thus, there are used leaf cells of which drive ability is a required minimum within the range in which the required timing specifications are satisfied. Accordingly, there can be generated a data path circuit mask layout which satisfies the timing specifications and which is reduced in circuit area.

Before the detail placement and routing process, there may be provided a cell placement improvement process for exchanging the placement of the schematic leaf cells such that the value of the predetermined objective function is optimized.

This exchanges the placement of the schematic leaf cells such that the value of the predetermined objective function is optimized. Thus, there can more securely be generated a data path circuit mask layout which satisfies the timing specifications and the contour conditions and which is reduced in circuit area.

[BRIEF DESCRIPTION OF THE DRAWINGS]

FIG. 5 is an example of connection information for illustrating the function macro expansion process, in which

FIG. 6 is a view illustrating the drive ability optimization process, in which

FIG. 7 is a view illustrating selection of leaf cells in the function macro expansion process, in which

FIG. 9 is a view illustrating the cell placement improvement process, in which

FIG. 11 illustrates the cell regeneration process, in which

FIG. 17 is an example of connection information which contains placement information and which is prepared in the form of a macro;

FIG. 20 is an example of layout data of a data path block.

[DETAILED DESCRIPTION OF THE INVENTION]

The following description will discuss a data path circuit layout design method according to the present invention with reference to the attached drawings.

(First Embodiment)

According to the first embodiment off the present invention, there are prepared function macros in each of which there is defined an expansion, according to the parameters, to a circuit comprising a plurality off schematic leaf cells, and the function blocks forming a data path circuit are described by such function macros.

Figure 1:
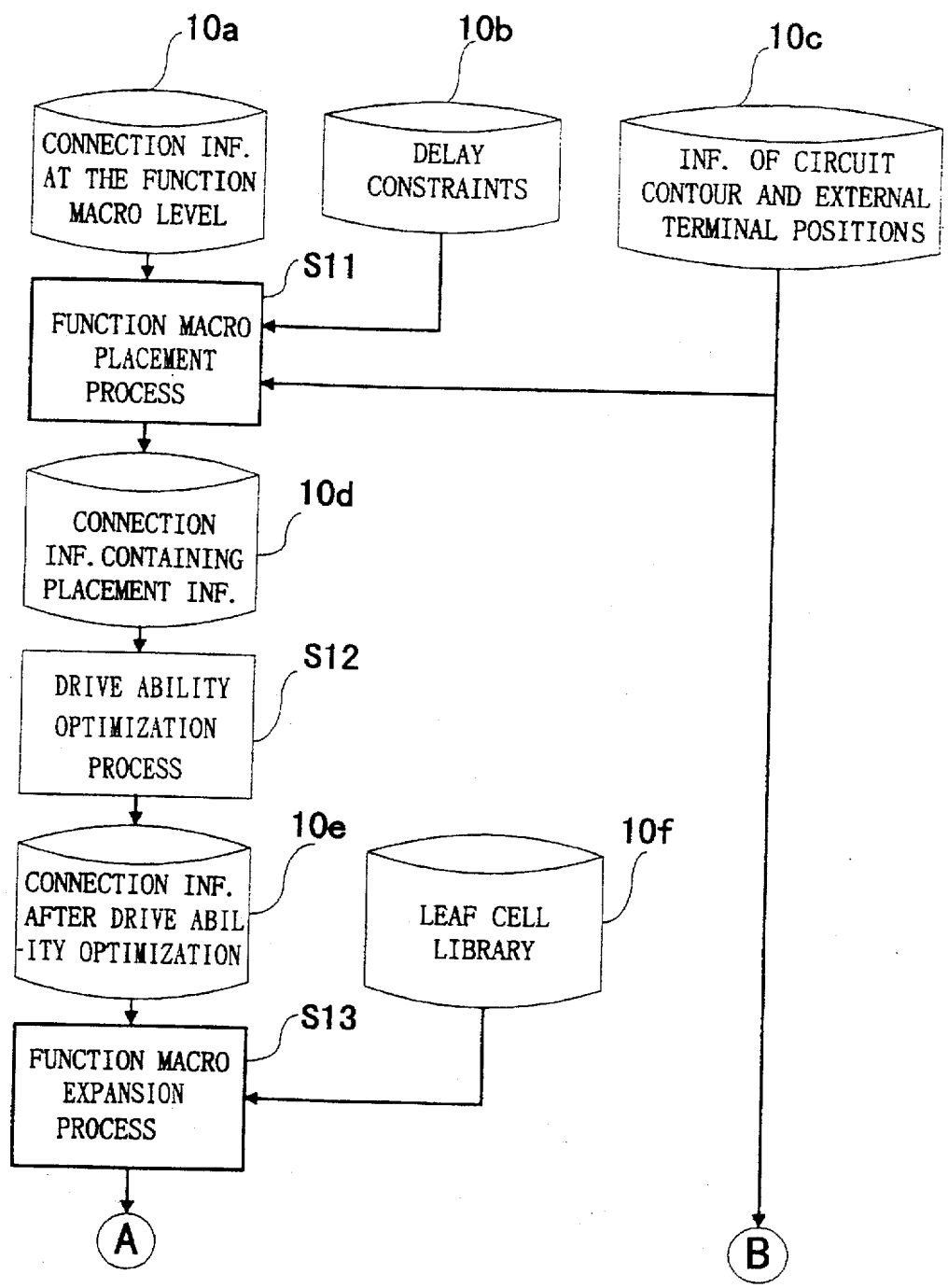
FIGS. 1(a) and 1(b) are flow charts of a data path circuit layout design method according to a first embodiment of the present invention.
Figure 1B:
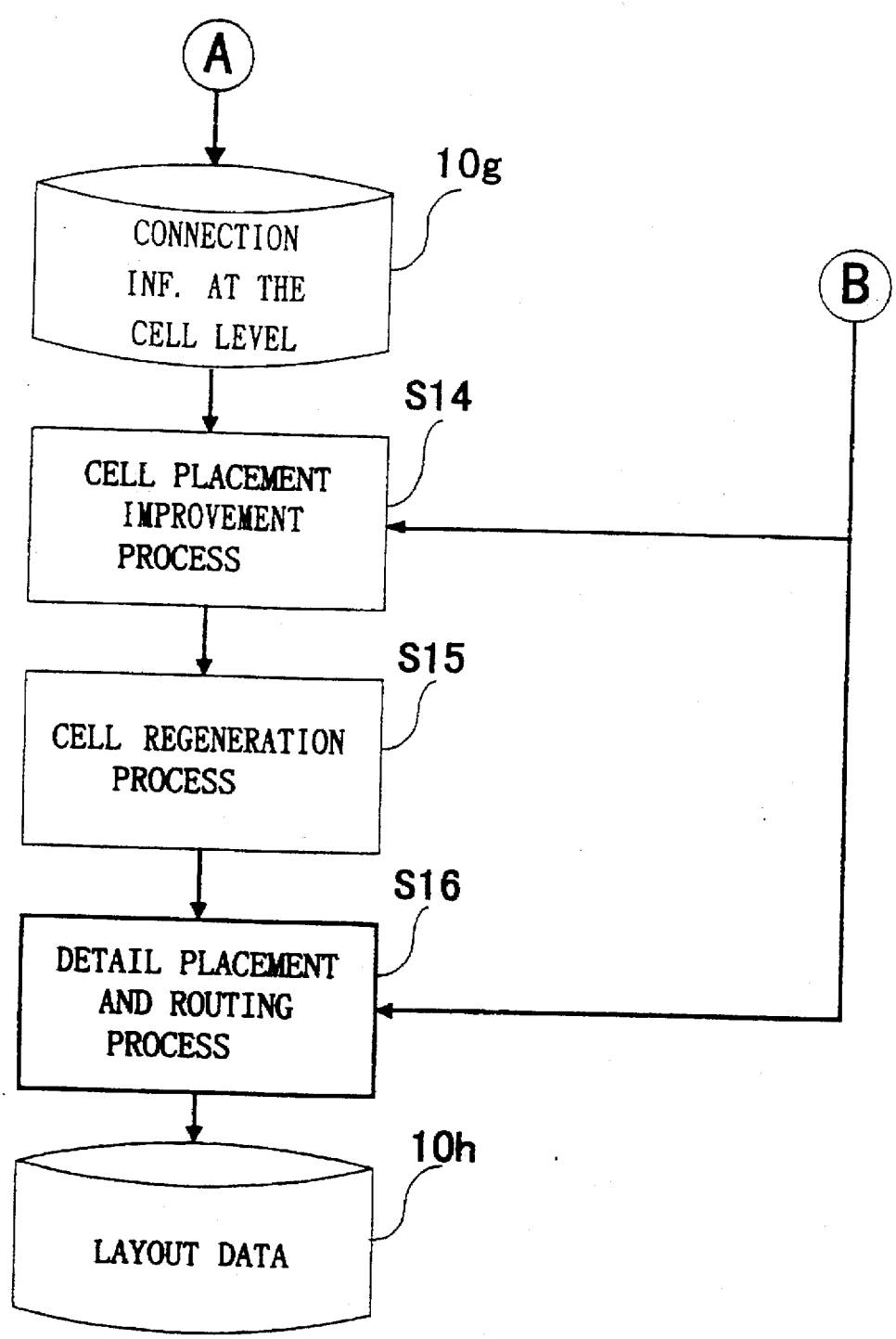

FIG. 1 is a flow chart illustrating the data path circuit layout design method according to the first embodiment of the present invention.

Shown in FIG. 1 are a function macro placement process S11, a drive ability optimization process S12, a function macro expansion process S13, a cell placement improvement process S14, a cell regeneration process S15 and a detail placement and routing process S16. Also shown in FIG. 1 are connection information on the function macro level 10a, delay constraints 10b determined for signal lines between or among function blocks, information of circuit contour and external terminal positions 10c obtained from the floor plan of an entire integrated circuit, connection information containing placement information 10d obtained by the function macro placement process S11, connection information after change in drive ability 10e obtained by the drive ability optimization process S12, a leaf cell library 10f used for expanding a function macro, connection information on the cell level 10g obtained by the function macro expansion process S13, and data path circuit layout data 10h obtained by the detail placement and routing process S16.

As to the data path circuit layout design method according to the first embodiment, the following description will first discuss the basic process flow. The basic process comprise three process shown in bold line in FIG. 1, i.e., the function macro placement process S11, the function macro expansion process S13 and the detail placement and routing process S16.

According to the function macro placement process S11, the placement of the function blocks of the data path circuit respectively described by function macros, is determined based on the connection information on the function macro level 10a, the delay constraints 10b and the information of circuit contour and external terminal positions 10c which have been given, and the connection information containing placement information 10d is then supplied. At this time, there is determined the placement of the function blocks such that the given delay constraints 10b are satisfied with the layout area minimized.

Figure 2:
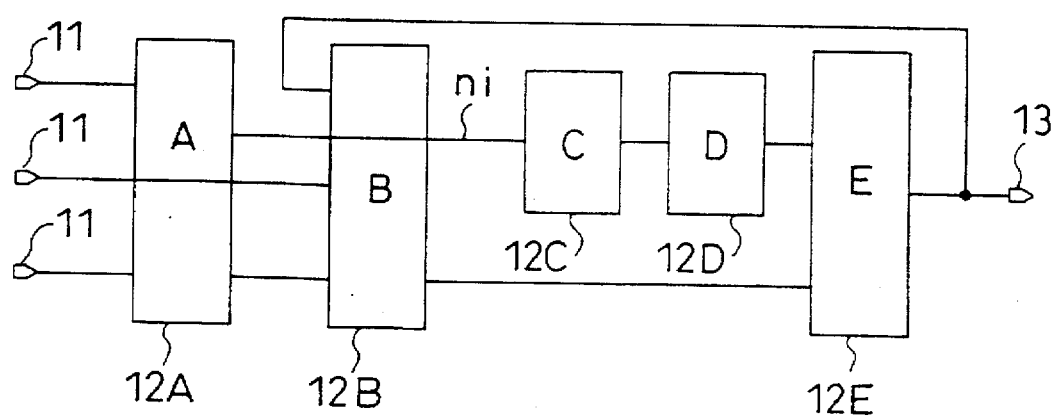
FIG. 2 is an example of connection information on the function macro level.

FIG. 2 shows an example of the connection information on the function macro level 10a. Shown in FIG. 2 are data input terminals 11, function blocks 12A, 12B, 12C, 12D, 12E described by function macros, and a data output terminal 13. In FIG. 2, nj refers to a wiring line to which delay constraints are given.

The following equation is an example of the delay constraints:

$$d(nj) \leq Cnj \qquad (1)$$

In the equation (1), d(nj) is the delay value of the wiring line nj and Cnj is the delay constrained value of the wiring line nj.

The following description will discuss a specific flow of the function macro placement process S11.

Figure 3:
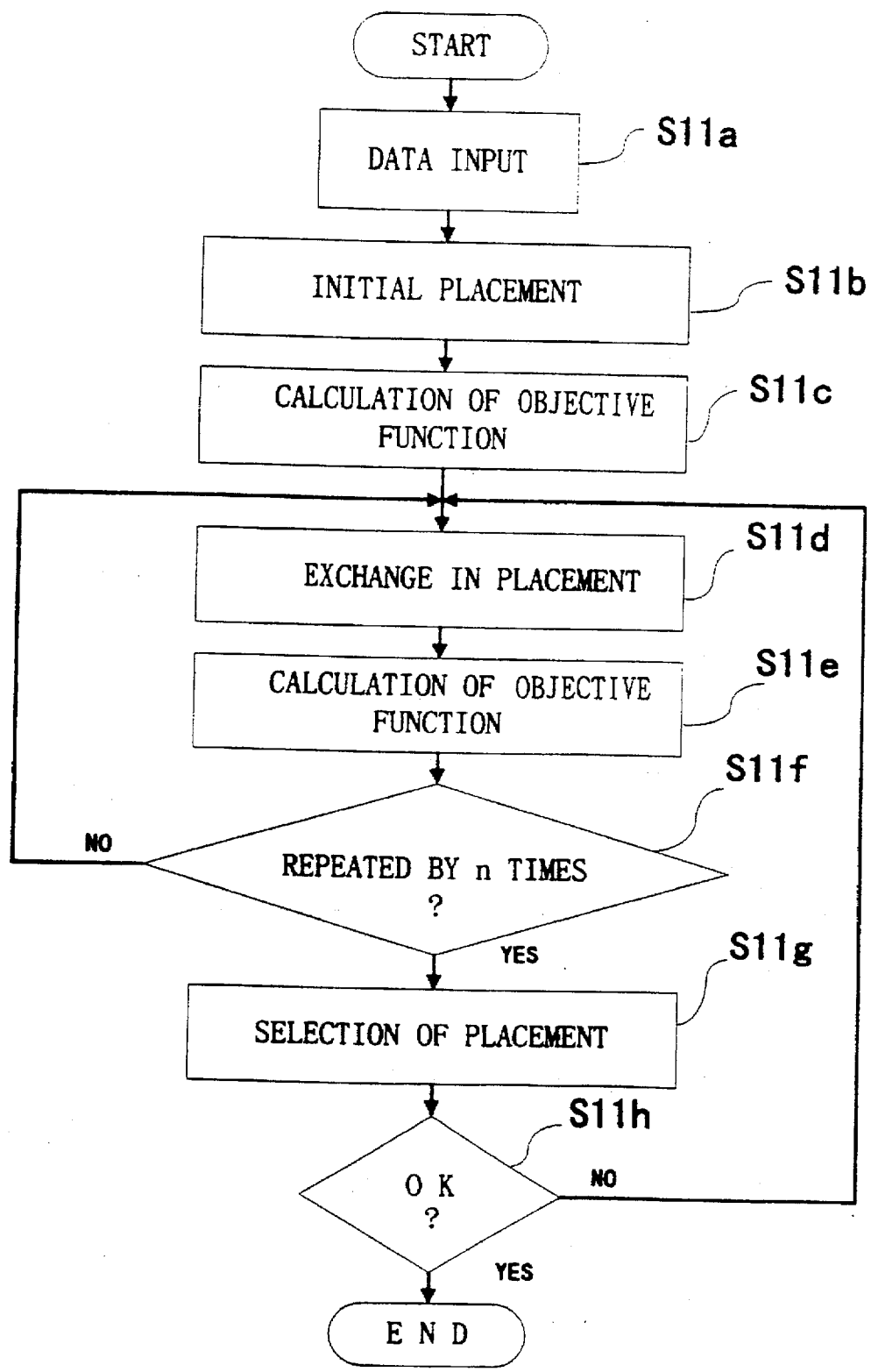
FIG. 3 is a flow chart of an example of the function macro placement process.

FIG. 3 is the flow chart of an example of the function macro placement process S11.

At a step S11a, the connection information on the function macro level 10a, the delay constraints 10b and the information of circuit contour and external terminal positions 10c are entered. At a step S11b, the initial placement of the function blocks is determined. At a step S11c, there is calculated an objective function for the initial placement obtained at the step S11b. The objective function will be discussed later. At a step S11d, the function blocks are exchanged in placement. At a step S11e, the objective function is calculated for the placement obtained at the step S11d. At a step S11f, it is judged whether or not each of the steps S11d and S11e has been repeated at the predetermined number of iteration times. In the affirmative, at a step S11g, there is selected, out of the function block placements hitherto obtained, the placement in which the objective function is optimized. At a step S11h, it is judged whether or not the function block placement selected at the step S11g is satisfactory. In the affirmative, the process is completed. In the negative, the selected placement is regarded as the initial placement and the sequence is then returned to the step S11d.

The objective function will now be discussed with an example taken. It is supposed that an objective function F(v) for a placement v is given by the following equation:

$$F(v) = \alpha \cdot T(v) + \beta \cdot L(v) + \gamma \cdot D(v) \qquad (2)$$

wherein T(v) is a term relating to the number of overflows of routing track, L(v) is a term relating to the total wiring length, D(v) is a term relating to deviation from the delay constraints and $\alpha$, $\beta$, $\gamma$ are constants.

The term T(v) relating to the number of overflows of routing track is expressed by the following equation:

$$T(v) = MAX_1 \{0, (N(b) - C(b))\} \qquad (3)$$

provided that $$C(b)=F(b)+(Bw-W(b))/w \qquad (4)$$

In the equation (3), N(b) is the number of wiring lines which pass on a function block b, C(b) is the number of wiring lines which can pass on the function block b, and $MAX_1$ means to obtain the maximum value out of the values for all the function blocks. In the equation (4), F(b) is the number of wiring lines which can pass on the function block b, Bw is the block width of the data path circuit, W(b) is the width of the function block b, and w is the width required for passing one wiring line.

The term L(v) relating to the total wiring length is expressed by the following equation:

$$L(v)=\Sigma_1 \; [\{Y1(n)-Y2(n)\}+\{X1(n)-X2(n)\}] \qquad (5)$$

In the equation (5), Y1(n) is the Y-coordinate of the uppermost function block out of the function blocks connected to a wiring line n, Y2(n) is the Y-coordinate of the lowermost function block out of the above-mentioned function blocks, X1(n) is the X-coordinate of the rightmost function block out of the above-mentioned function blocks, and X2(n) is the X-coordinate of the leftmost function block out of the above-mentioned function blocks. $\Sigma_1$ means to obtain the sum of the values for all the wiring lines.

The term D(v) relating to deviation from the delay constraints is expressed by the following equation:

$$D(v)=MAX_2 \; \{0, (Y1(n)-Y2(n))-P(n)\} \qquad (6)$$

In the equation (6), Y1(n) is the Y-coordinate of the uppermost function block out of the function blocks connected to a wiring line n, Y2(n) is the Y-coordinate of the lowermost function block out of the above-mentioned function blocks, and P(n) is delay constraints for the wiring line n. $MAX_2$ means to obtain the maximum value out of the values for all the wiring lines to which delay constraints have been given.

The function macro placement process S11 is executed such that the value of the objective function F(v) above-mentioned is minimized. Thus, there can be obtained the function block placement in which the number of overflows of routing track is small, in which the average signal delay time is short and in which the deviation from the delay constraints is less. By suitably adjusting the values of the coefficients α, β, γ in the terms, the weighting of the terms can be changed.

Figure 4:
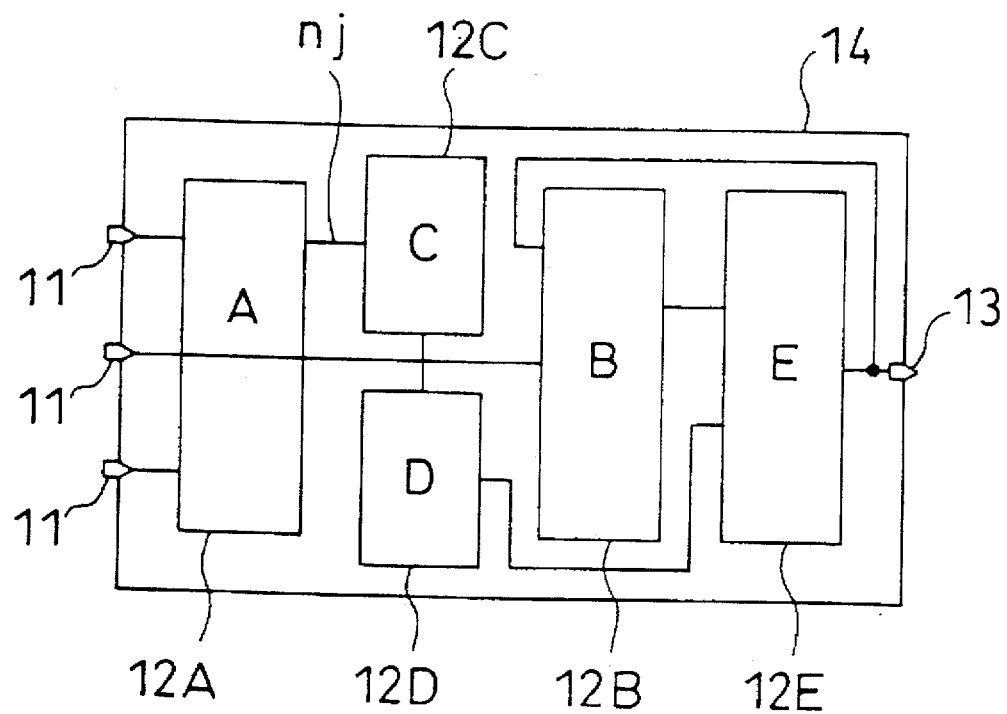
FIG. 4 is an example of connection information containing placement information.

FIG. 4 shows the connection information containing placement information 10d which has been determined, by the function macro placement process S11, based on the connection information on the function macro level 10a shown in FIG. 2. Shown in FIG. 4 are data input terminals 11, function blocks 12A, 12B, 12C, 12D, 12E described by function macros, a data output terminal 13 and a circuit block contour 14. In FIG. 4, nj is a wiring line to which delay constraints have been given. The placement of the function blocks is determined such that the wiring line nj to which delay constraints have been given, is minimized in length with the circuit block also minimized in area.

In FIG. 4, the function blocks 12C and 12D are vertically arranged at the second column from the left side. The algorithm shown in FIG. 3 enables a plurality of function blocks to be vertically arranged in one column. More specifically, there are available two methods, i.e., a method in which it is based on the assumption to vertically arrange a plurality of function blocks in one column from the initial point, and a method in which a plurality of function blocks are first horizontally arranged in line and, when there is a vacant zone in the circuit block, there are then searched, out of adjacent function blocks, function blocks which can be vertically arranged in the same column.

Then, the function macro expansion process S13 is executed. In the function macro expansion process S15, with the cell information in the leaf cell library 10f applied, the function macros are expanded to change the connection information containing placement information 10d to the connection information on the cell level 10g.

Figure 5A:
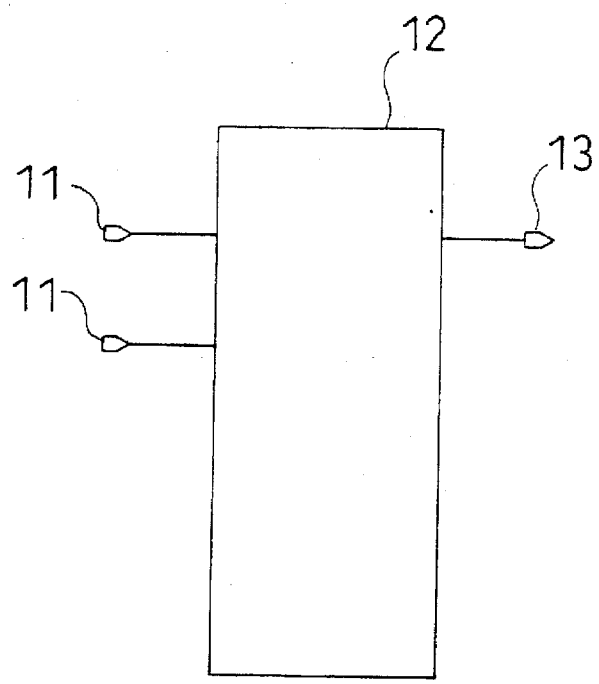
FIG. 5(a) is the connection information on the function macro level before expansion.
Figure 5B:
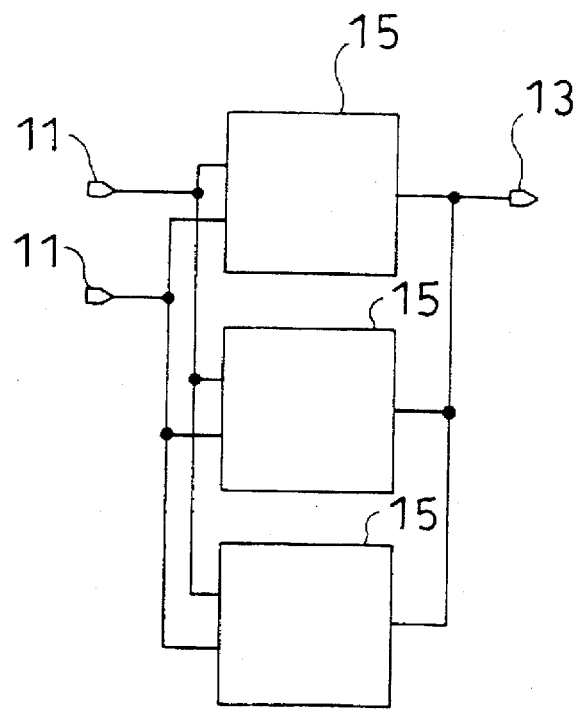
FIG. 5(b) is the connection information on the cell level after expansion.

FIG. 5 is an example of connection information for explaining the function macro expansion process S13, in which FIG. 5(a) shows connection information on the function macro level before expansion, and FIG. 5(b) shows connection information on the cell level after expansion. Shown in FIG. 5 are data input terminals 11, a function block 12 described by a function macro, a data output terminal 13, and leaf cells 15. By the function macro expansion process S13, the leaf cells 15 are so placed as to achieve the function of the function block 12 described by the function macro. That is, the leaf cells 15 are disposed based on the given connection information on the function macro level with the data input terminals 11 and the data output terminal 13 positioned as they are. Thus, there is supplied the connection information 10g on the level of a cell which is a unit smaller in area.

Finally, the detail placement and routing process S16 is to be executed. In the detail placement and routing process S16, detail cell placement and routing are executed based on the connection information on the cell level 10g, thereby to supply mask layout data.

The foregoing has discussed the flow of the basic process of the data path circuit layout design method according to the first embodiment. In fact, the basic process are executed with a variety of process added thereto.

First, the drive ability optimization process S12 will be discussed. The drive ability optimization process S12 is generally executed after the function macro placement process S11. According to the drive ability optimization process S12, the connection information containing placement information 10d obtained by the function macro placement process S11, is evaluated for signal delay, and the output drive ability of a function block is changed as necessary.

Figure 6A:
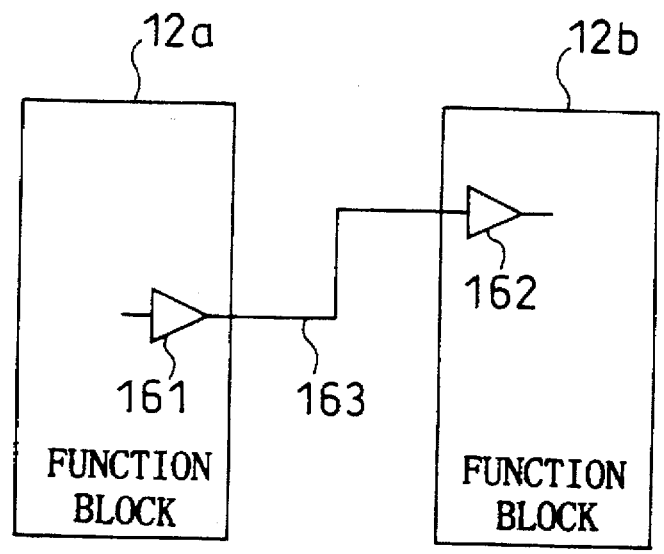
FIG. 6(a) shows an example of the data signal line and FIG. 6(b) is an example of the control signal line.
Figure 6B:
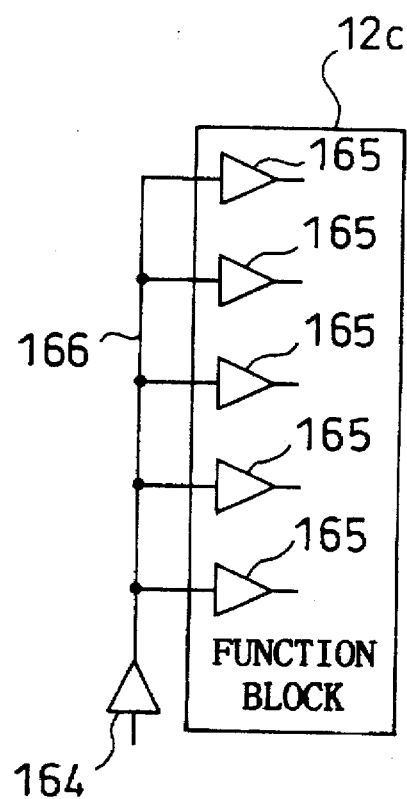

FIG. 6 is a view illustrating the drive ability optimization process S12. FIG. 6(a) shows an example of the data signal line, and FIG. 6(b) shows an example of the is control signal line. Shown in FIG. 6 are function blocks 12a, 12b, 12c respectively described by function macros, a data signal output buffer 161 in the function block 12a, a data signal input gate 162 in the function block 12b, a data signal line 163 to be driven by the data signal output buffer 161, a control signal output buffer 164, control signal input gates 165 in the function block 12c, and a control signal line 166 to be driven by the control signal output buffer 164.

In FIG. 6(a), when delay constraints are given to the data signal line 163, the resistance and the capacitance are estimated according to the wiring length and the data signal output buffer 161 is changed in magnitude such that the delay constraints are satisfied with the capacitance of the data signal input gate 162 taken into consideration. In FIG. 6(b), when delay constraints are given to the control signal line 166, the resistance and the capacitance are estimated and the total capacitance of the control signal input gates 165 is then calculated based on the number of the control signal input gates 165 and the control signal output buffer 164 is then changed in magnitude such that the delay constraints are satisfied. The drive ability optimization process S12 is executed in the manner above-mentioned and the result is supplied as the connection information after change in drive ability 10e.

In the function macro expansion process S13, there are instances where there is added a process in which various types of cells having the same function and different shapes, are previously prepared in the leaf cell library 10f and in which there are selected leaf cells having the shapes most suitable for the circuit block contour when expanding each function macro into cells.

Figure 7A:
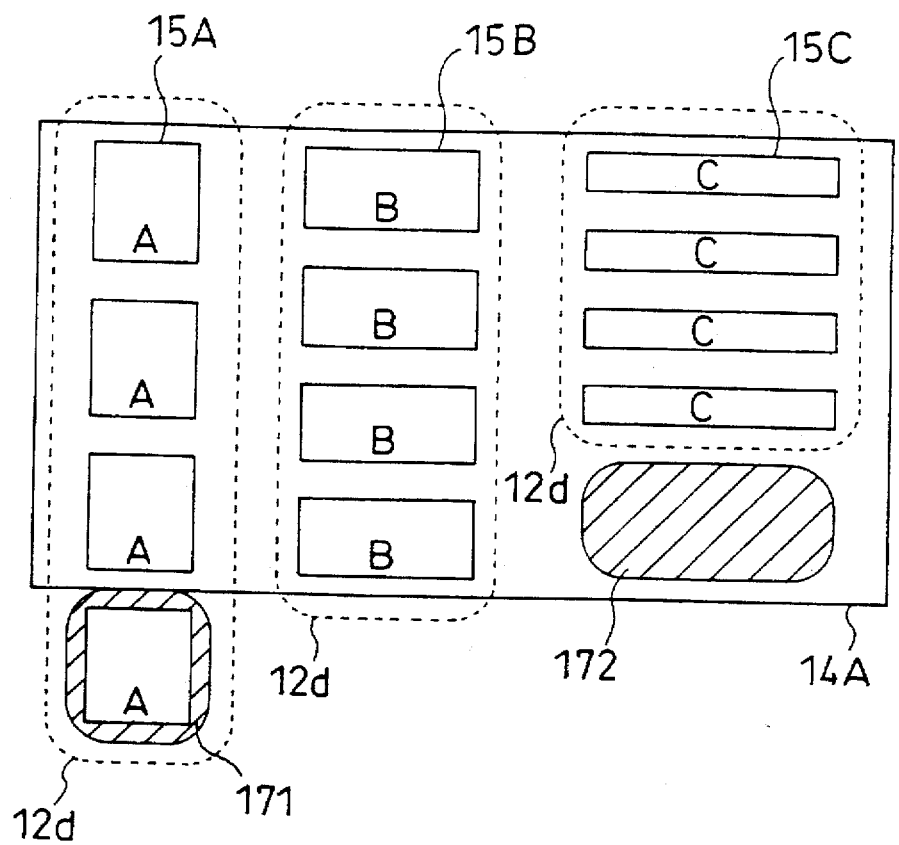
FIG. 7(a) shows an example of function blocks each of which is expanded into four leaf cells having the same function.
Figure 7B:
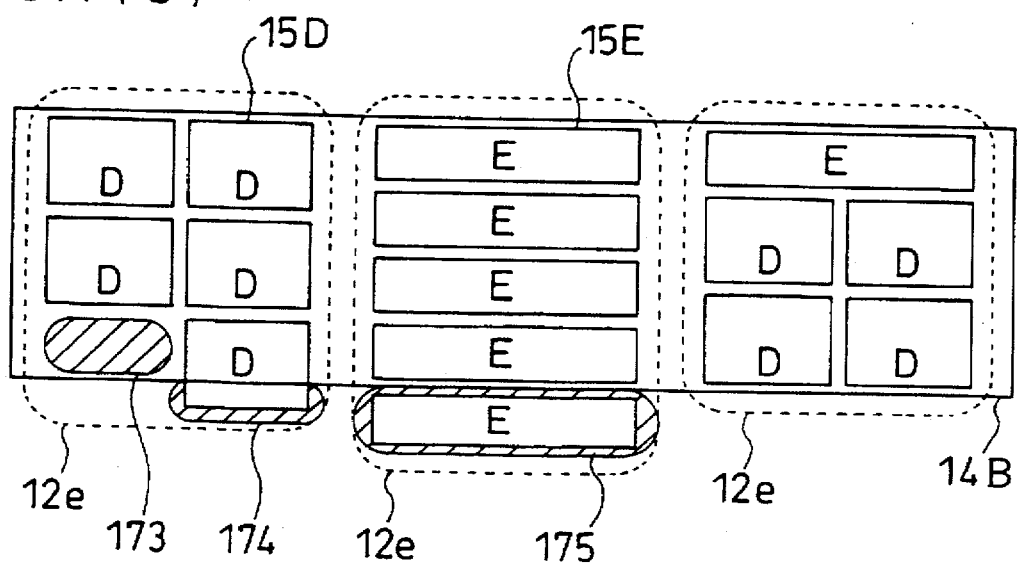
FIG. 7(b) shows an example of function blocks each of which is expanded into five leaf reels having the same function.

FIG. 7 is a view illustrating how to select leaf cells in the function macro expansion process S13. FIG. 7(a) shows an example of function blocks each expanded into four leaf cells having the same function, and FIG. 7(b) shows an example of function blocks each expanded into five leaf cells having the same function. Shown in FIG. 7 are function blocks 12d, 12e respectively described by function macros, circuit block contours 14A, 14B, leaf cells 15A, 15B, 15C, 15D, 15E, a protruding zone 171 in which a function block 12d protrudes from the circuit block contour 14A, a vacant zone 172 within the circuit block contour 14A, a vacant zone 173 within the circuit block contour 14B, and protruding zones 174, 175 in which function blocks 12e protrude from the circuit block contour 14B. The leaf cells 15A, 15B, 15C have the same function, and the leaf cells 15D, 15E have the same function.

In expanding the function block 12d into leaf cells, the protruding zone 171 is formed when the leaf cells 15A are selected, and the vacant zone 172 is formed when the leaf cells 15C are selected, as shown in FIG. 7(a). When there are selected the leaf cells 15B of which general shape is the closest to the circuit block contour 14A, neither protruding zone nor vacant zone is formed. Accordingly, the leaf cells 15B are selected.

In expanding the function block 12e into leaf cells, the vacant zone 173 and the protruding zone 174 are formed when the leaf cells 15D are selected and arranged in two columns, and the protruding zone 175 is formed when the leaf cells 15E are selected and vertically arranged in one column, as shown in FIG. 7(a). When there are selected, as combined with each other, leaf cells 15D and 15E having different shapes, neither protruding zone nor vacant zone is formed. Accordingly, leaf cells of the same type are not selected, but a combination of four leaf cells 15D with one leaf cell 15E is selected.

Thus, when expanding the function macros into cells by the function macro expansion process S13, there is executed a process for selecting, from the leaf cell library 10f, leaf cells having the most suitable shapes. Thus, there can be formed a layout reduced in wasteful zone.

The following description will discuss the cell placement improvement process S14. The cell placement improvement process S14 is executed subsequent to the function macro expansion process S13 for improving the leaf cell placement based on the connection information on the cell level 10g obtained by the function macro expansion process S13.

Figure 8:
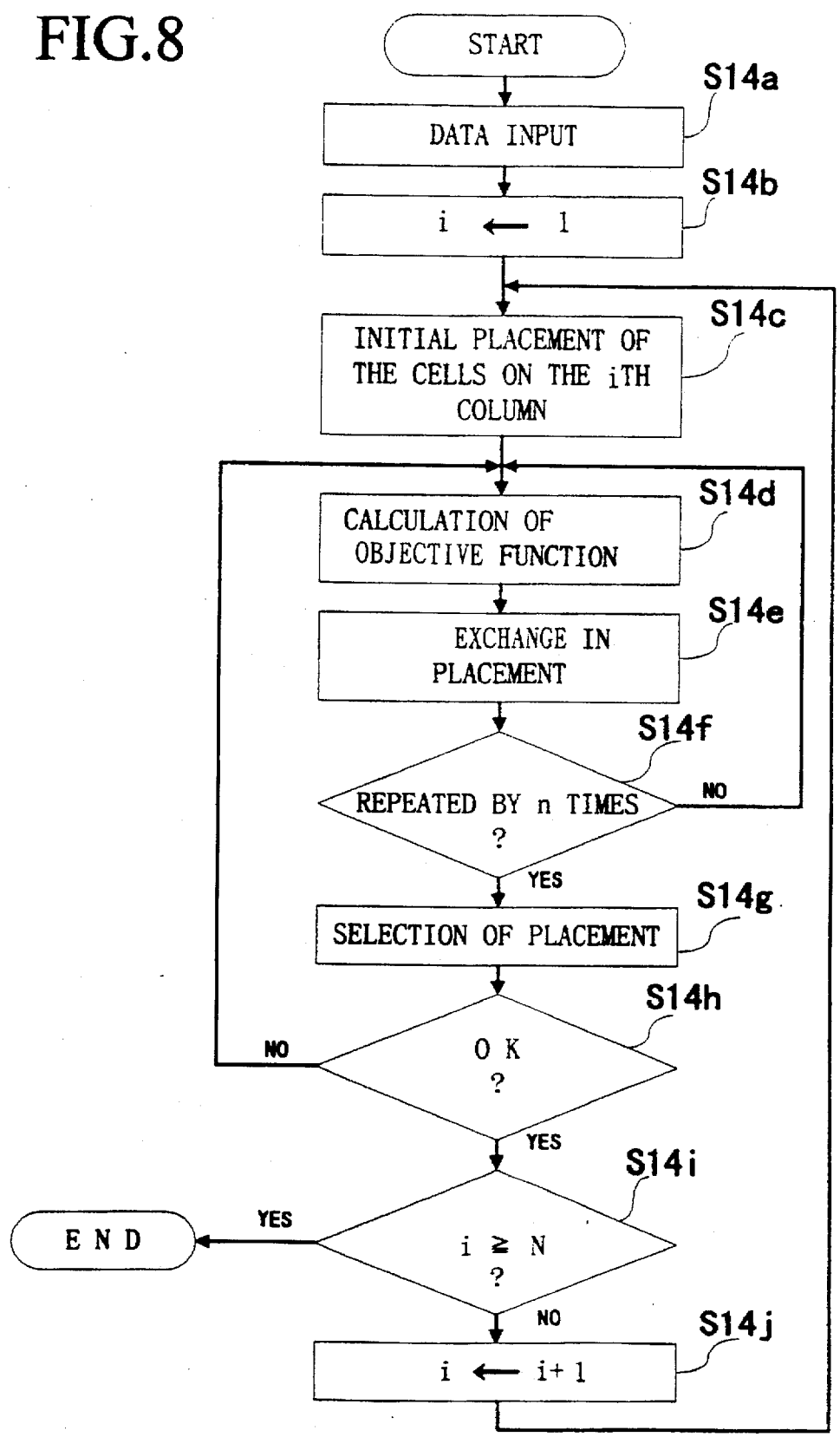
FIG. 8 is a flow chart of an example of the cell placement improvement process.

FIG. 8 is the flow chart of an example of the cell placement improvement process S14.

At a step S14a, the connection information on the cell level 10g and information of circuit contour and external terminal positions 10c are entered. At a step S14b, a variant i is set to 1.

At a seep S14c, the initial placement of the leaf cells on the ith column is determined. At a seep S14d, an objective function is calculated for the current leaf cell placement. At a step S14e, the leaf cell placement is exchanged. At a step S14f, it is judged whether or not each of the steps S14d, S14e has been repeated at a predetermined number of iteration times. In the affirmative, at a step S14g, there is selected, out of the placements, the leaf cell placement in which the objective function is optimized. At a step S14h, it is judged whether or not the leaf cell placement selected at the step S14g is satisfactory. In the affirmative, the sequence proceeds to a step S14i. In the negative, the placement is regarded as the initial placement of the leaf cells on the ith column, and the sequence is then returned to the step S14d.

At the step S14i, it is judged whether or not the process above-mentioned have been executed on all the leaf cell columns. In the affirmative, the sequence is finished. In the negative, 1 is added to the variant i at a step S14j, and the sequence is returned to the step S14c.

The following description will discuss an example of the objective function to be used in the process shown in FIG. 8. It is now supposed that the objective function for a placement p is set to C(p). The objective function C(p) is expressed by the following equation:

$$C(p) = \Sigma_2 L(ni) \qquad (7)$$

In the equation (7), ni is a wiring line, L(ni) is the length of the wiring line ni, $\Sigma_2$ means to obtain the total sum of the lengths of all the wiring lines. More specifically, the objective function refers to the total wiring length.

Figure 9A:
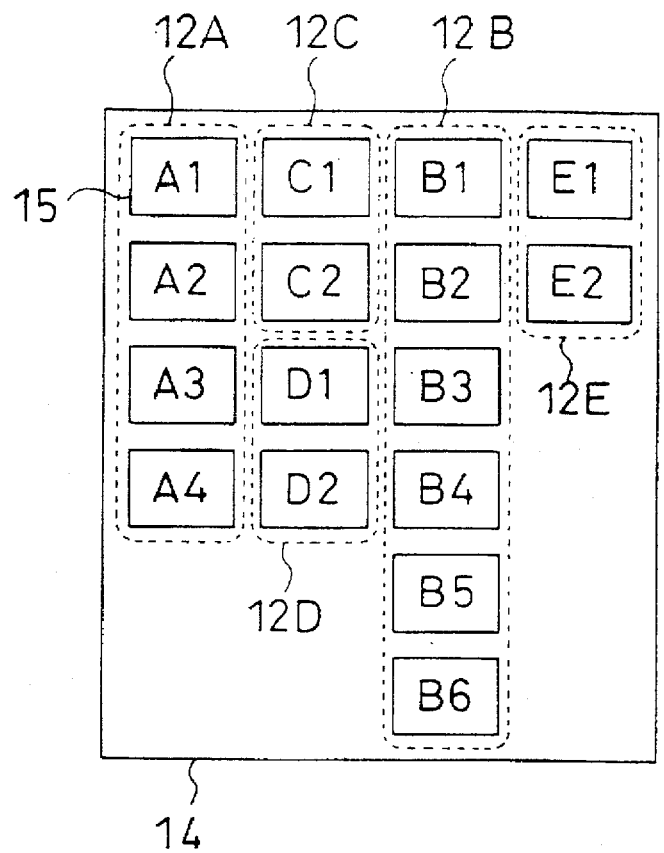
FIG. 9(a) shows the placement of the leaf cells before the placement improving process is executed.
Figure 9B:
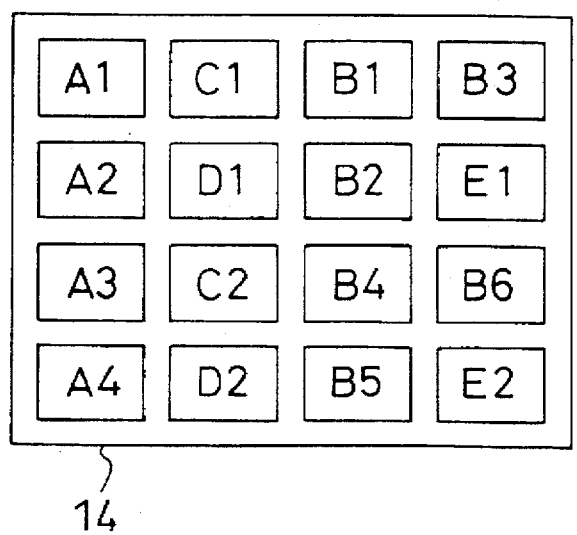
FIG. 9(b) shows the placement of the leaf cells after the placement improving process has been executed.

FIG. 9 is a view for explaining the cell placement improvement process S14. FIG. 9(a) shows the placement of leaf cells before the placement improving process, and FIG. 9(b) shows the leaf cell placement after the placement improving process. Shown in FIG. 9 are function blocks 12A, 12B, 12C, 12D, 12E described by function macros, a circuit block contour 14 and leaf cells 15.

In FIG. 9(a), the leaf cells are positioned as expanded based on the example of the connection information containing placement information 10d shown in FIG. 4. The function block 12A is expanded into four leaf cells, the function block 12B is expanded into six leaf cells, and each of the function blocks 12C, 12D, 12E is expanded into two leaf cells.

In FIG. 9(b), to reduce the circuit block in area, two leaf cells out of the six leaf cells placed on the third column, are moved to the fourth column. Further, to shorten the total wiring length, leaf cells out of the leaf cells placed on the second column are changed in position.

Thus, the cell placement improvement process S14 improves the leaf cells in placement to form a layout which is small in area and which is short in signal delay time.

Finally, the cell regeneration process S15 will now be described. The cell regeneration process S15 is to be executed subsequent to the function macro expansion process S13 (or the cell placement improvement process S14) for regenerating leaf cells for each function block based on the connection information on the cell level 10g obtained by the function macro expansion process S13.

Figure 10:
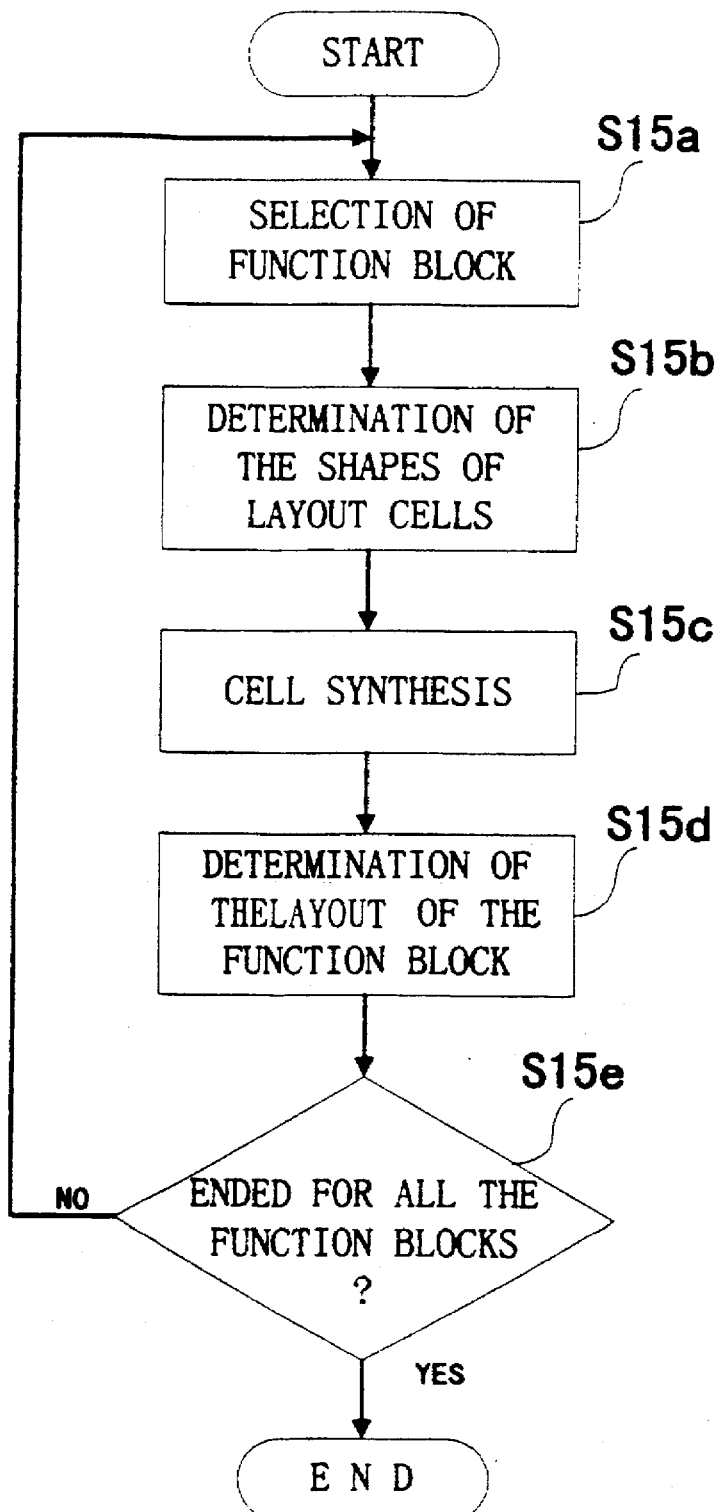
FIG. 10 is a flow chart of an example of the cell regeneration process.

FIG. 10 is a flow chart of an example of the cell regeneration process S15.

At a step S15a, there is selected a function block for which leaf cells are to be regenerated. At a step S15b, there are determined, for the selected function block, the shapes of the leaf cells to be regenerated, according to the circuit block contour conditions and the number of the leaf cells forming the function block. At a step S15c, the leaf cells are regenerated using a cell synthesizing technology according to the leaf cell shapes thus determined and the connection information on the leaf cell level. At a step S15d, a layout of the selected function block is determined according to the leaf cells thus regenerated. At a step S15e, it is judged whether or not the process S15 has been executed for all the function blocks. If there is a function block for which the process S15 has not been executed yet, the sequence is returned to the step S15a and the process S15 will be executed on this function block.

FIG. 11 is a view illustrating the cell regeneration process S15. Shown in FIG. 11 are function blocks 12f, 12g described by function macros, leaf cells 15a, 15b, 15c, and vacant zones 18 in a function block.

Figure 11A:
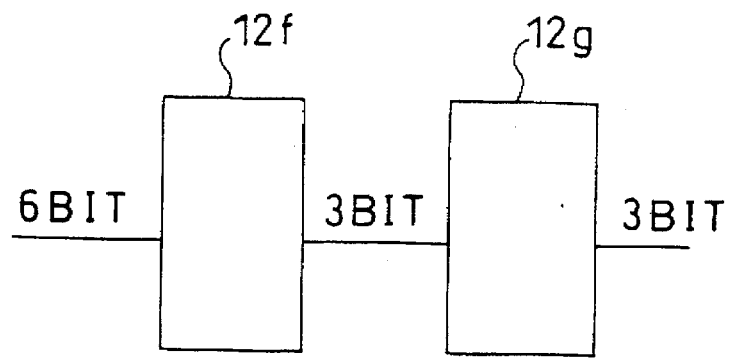
FIG. 11(a) shows an example of connection information.

FIG. 11(a) is an example of the connection information containing placement information 10d obtained by the function macro placement process S11. The number of bits of a data to be entered is equal to 6 in the function block 12f and 3 in the function block 12g.

Figure 11B:
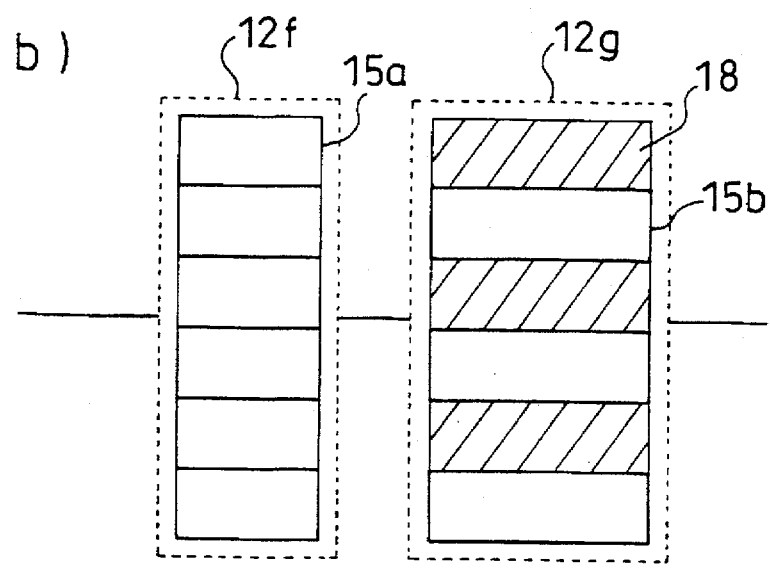
FIG. 11(b) shows the result obtained after the function macro expansion process and the cell placement improvement process have been executed.

FIG. 11(b) shows the result obtained by executing the function macro expansion process S13 and the cell placement improvement process S14 on the connection information in FIG. 11(a). In FIG. 11(b), there are used leaf cells having the same height in the bit direction. In this example, since the function blocks are different in data bit number, the vacant zones 18 are inevitably formed in the function block 12g.

Figure 11C:
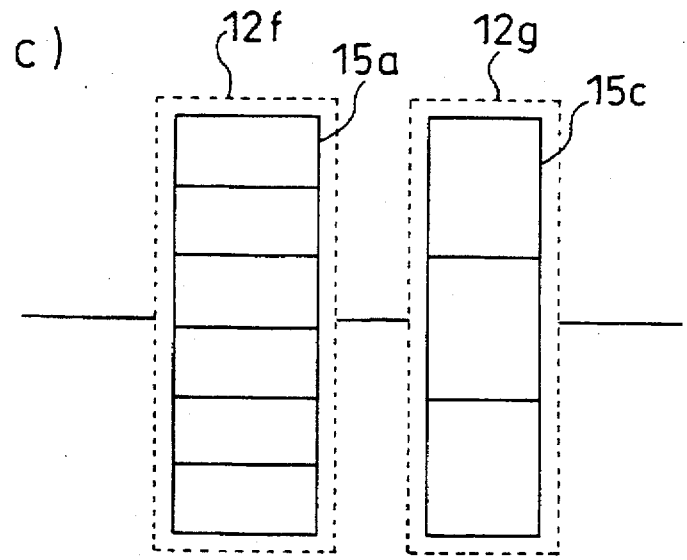
FIG. 11(c) shows the result obtained after the cell synthesizing process has been executed.

FIG. 11(c) shows the result obtained by executing the cell regeneration process S15 on the placement in FIG. 11(b). In FIG. 11(c), the function block 12g is formed by leaf cells which have been generated by cell synthesis and each of which has the height corresponding to two bits. This eliminates the vacant zones in the function block 12g. Further, the function block 12g is remarkably reduced in width, thereby to considerably reduce the circuit block in area.

Thus, the cell placement improvement process S14 enables the entire circuit block to be remarkably reduced in area.

As discussed in the foregoing, the data path circuit layout design method according to the first embodiment of the present invention can generate, for a data path circuit comprising function blocks respectively described by function macros, a mask layout which securely satisfies the timing specifications, which is minimized in circuit area and which satisfies the circuit block contour conditions.

The following description will discuss a parameterized function macro.

Figure 12:
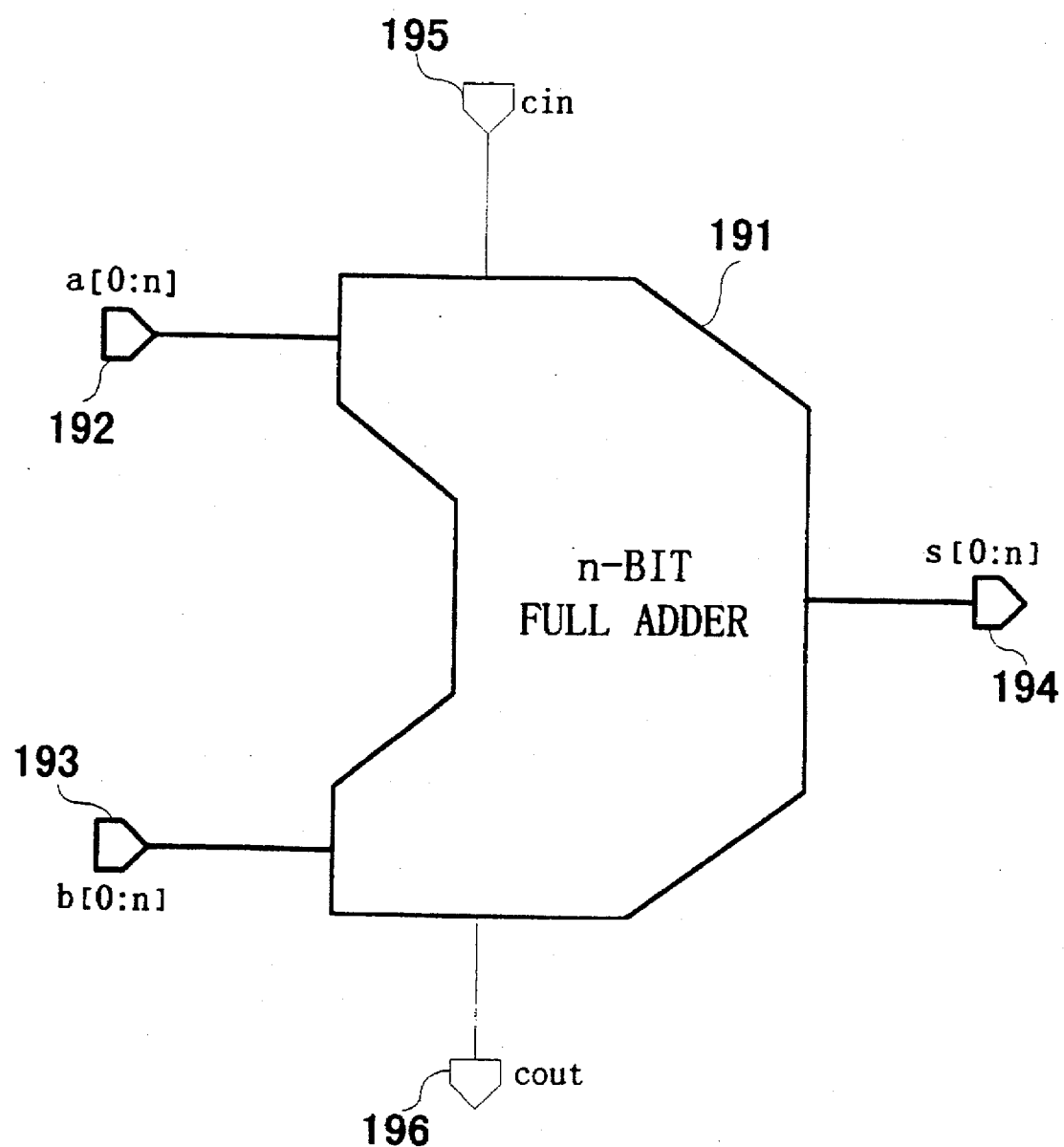
FIG. 12 shows an example of a function macro.

FIG. 12 shows a function macro of an n-bit full adder. Shown in FIG. 12 are an n-bit full adder 191, data bus input terminals 192, 193, a data bus output terminal 194, a carry input terminal 195, and a carry output terminal 196. Each of the bit numbers of the data bus input terminals 192, 193 and the data bus output terminal 194, is parameterized.

Figure 13:
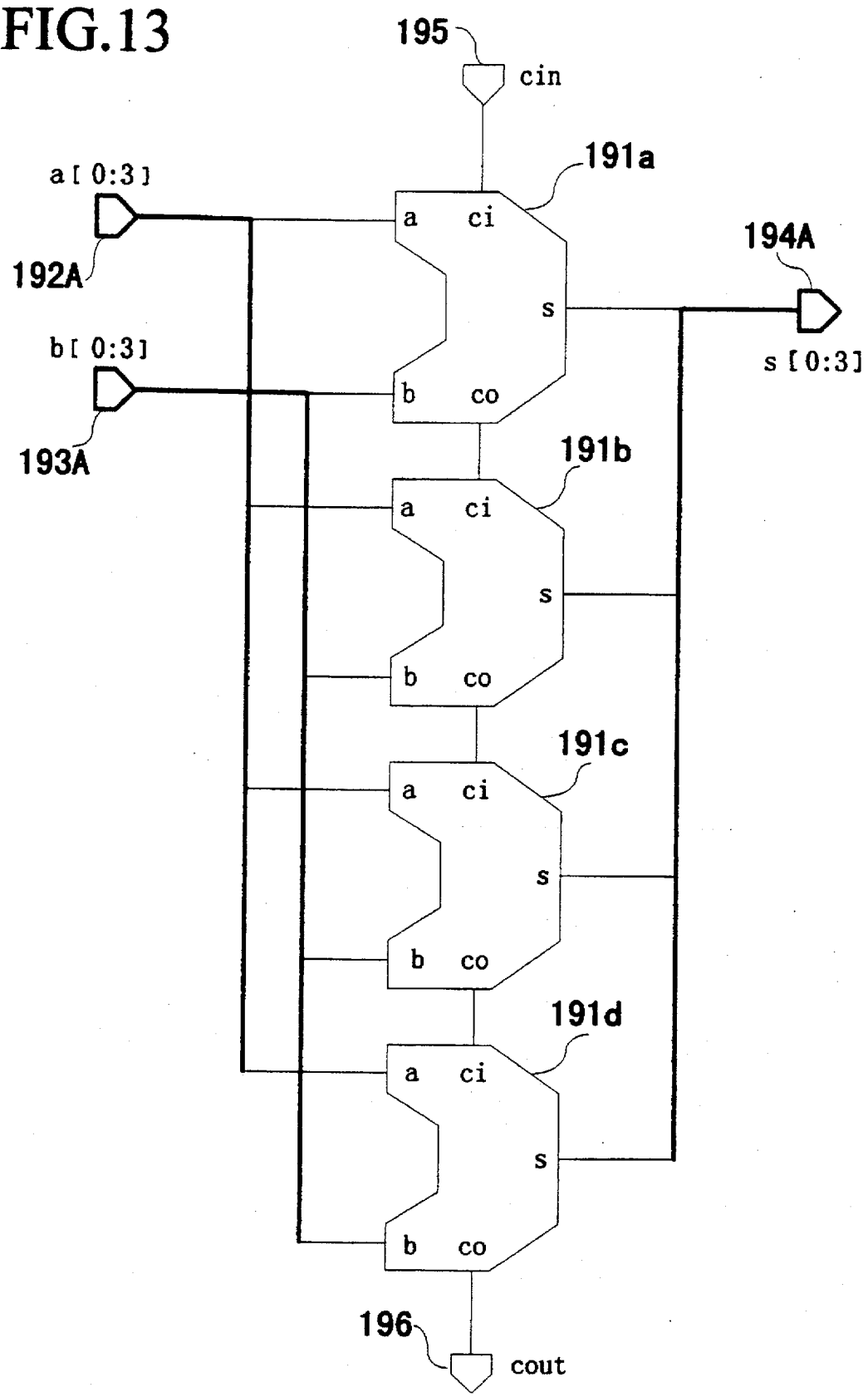
FIG. 13 shows the result obtained as expanded by giving parameters to a function macro.

FIG. 13 is a view of the full adder shown in FIG. 12 as expanded to the cell level with 4 given, as the bit number, to the function macro. Shown in FIG. 13 are 1-bit full adders 191a, 191b, 191c, 191d, 4-bit data bus input terminals 192A, 193A, and a 4-bit data bus output terminal 194A. As shown in FIG. 13, to achieve a 4-bit full adder, the 1-bit full adders 191a~191d are disposed and necessary wiring lines are installed among cells and among cells and terminals. Thus, when there is previously prepared a function macro for a full adder in which the bit number is parameterized, a full adder having the desired arrangement can readily be prepared as necessary.

Thus, there are described, in a parameterized function macro, cells required for forming the function macro and connection information among the cells and among the cells and terminals. Thus, according to a given parameter, the required cell-level connection information is prepared. In addition to the bit number, the magnitude of an output buffer or the like can also be parameterized.

Thus, according to the first embodiment, pieces of cell-level connection information in a variety of arrangements can be prepared even with a small-capacity library.

(Second Embodiment)

Figure 14A:
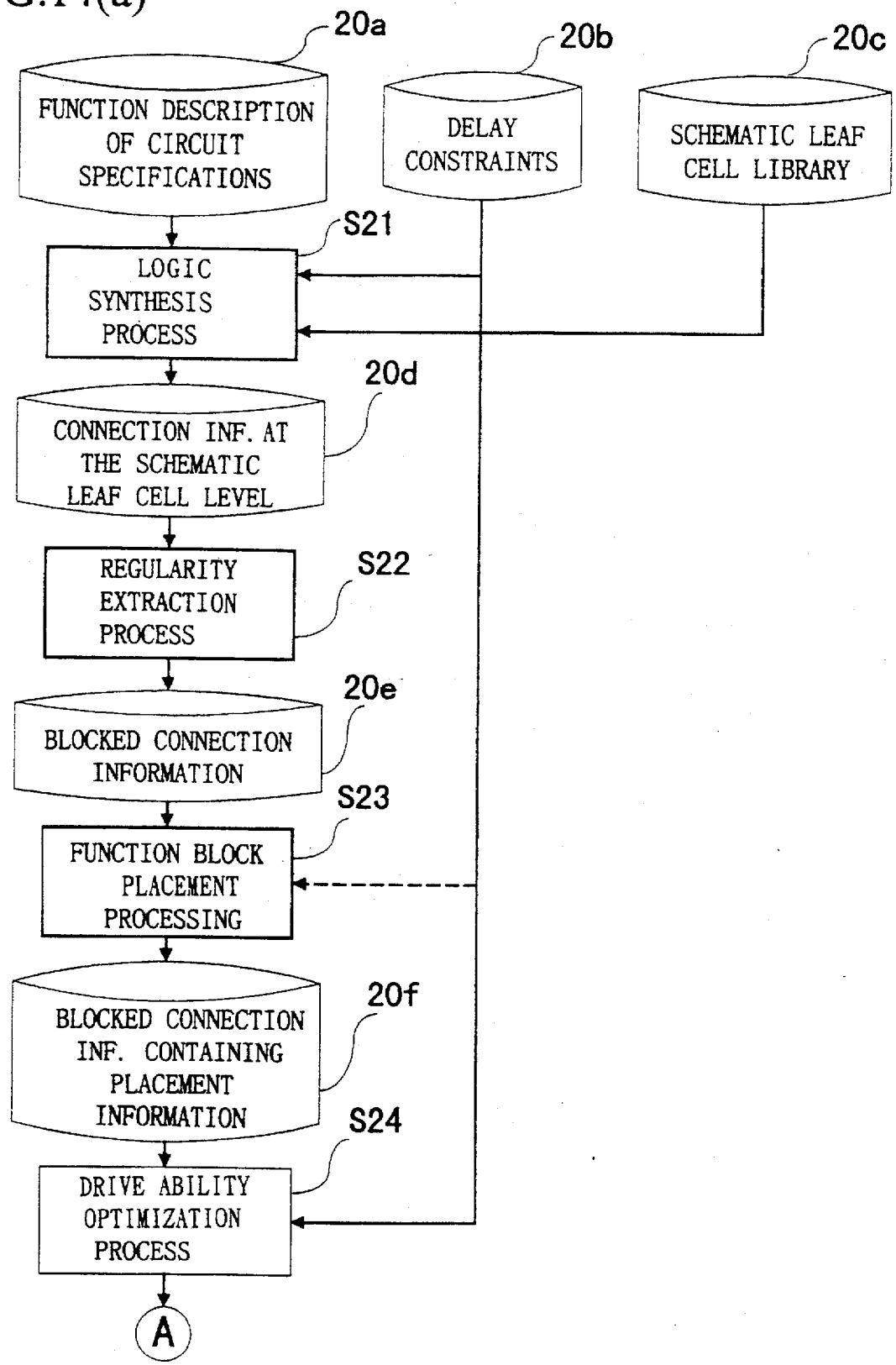
FIGS. 14(a) and 14(b) are flow charts of a data path circuit layout design method according to a second embodiment of the present invention.
Figure 14B:
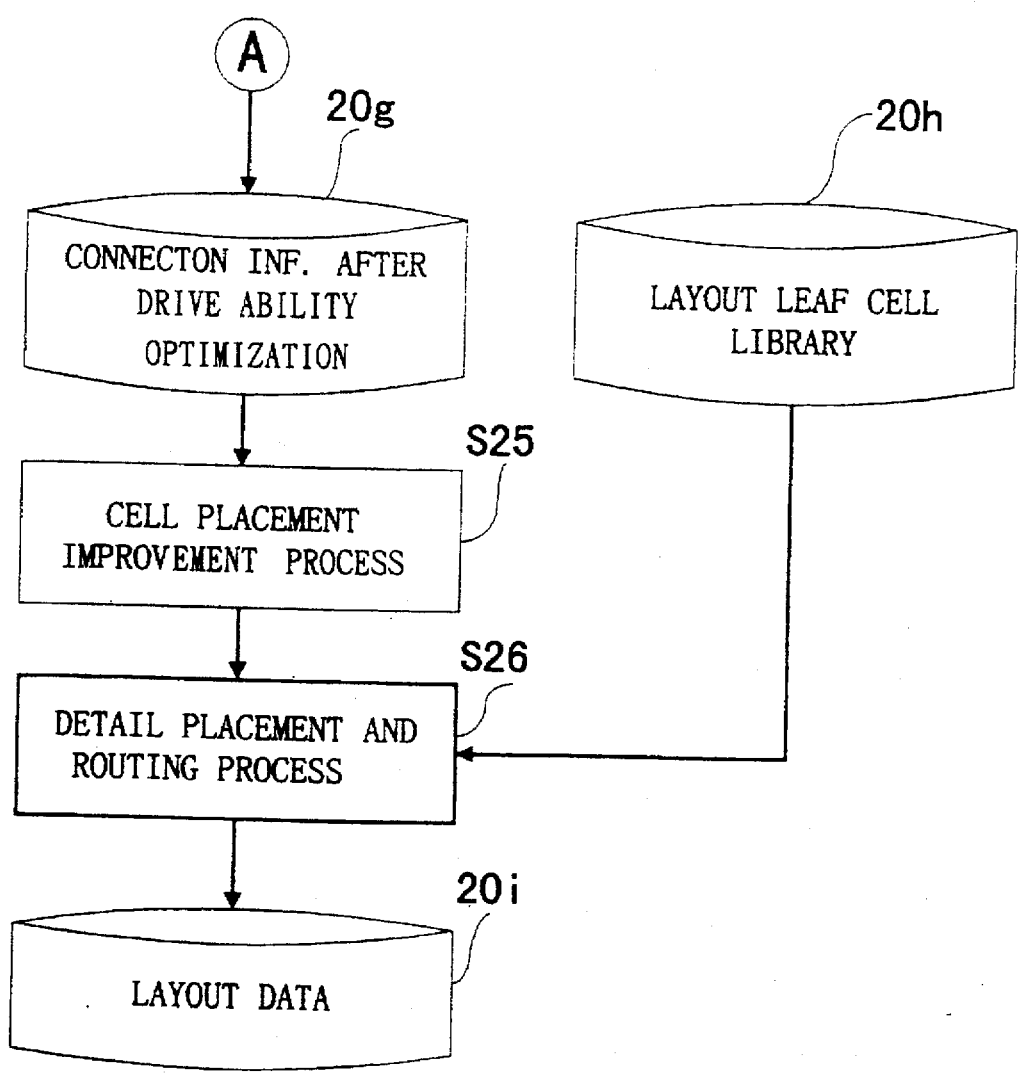

FIG. 14 is a flow chart of a data path circuit layout design method according to a second embodiment of the present invention.

Shown in FIG. 14 are a logic synthesis process S21, a regularity extraction process S22, a function block placement process S23, a drive ability optimization process S24, a cell placement improvement process S25 and a detail placement and routing process S26. Also shown in FIG. 14 are a function description of circuit specifications 20a, delay constraints 20b, a schematic leaf cell library 20c, connection information on the schematic leaf cell level 20d obtained by the logic synthesis process S21, blocked connection information 20e obtained by the regularity extraction process S22, blocked connection information containing placement information 20f obtained by the function block placement process S23, connection information after change in drive ability 20g obtained by the drive ability optimization process S24, a layout leaf cell library 20h and data path circuit layout data 20i obtained by the detail placement and routing process S26.

As to the data path circuit layout design method according to the second embodiment, the following description will first discuss the basic process flow. The basic process comprise four process shown in bold line in FIG. 14, i.e., the logic synthesis process S21, the regularity extraction process S22, the function block placement process S23 and the detail placement and routing process S28.

The logic synthesis process S21 is arranged to conduct logic synthesis based on (i) the function description of circuit specifications 20a, (ii) the delay constraints 20b and (iii) the schematic leaf cell library 20c which have been given, thereby to supply connection information on the schematic leaf cell level 20d.

As an example of the function description of circuit specifications 20a, the following shows an example of data in the function description language Verilog HDL:

```
module datapath (CLK, A, B, C, S, Y);
parameter   nbit = 4;
input                   CLK, C, S;
input       [bbit-1:0]      A, B, Y;
reg         [nbit-1:0]      ra, rb:
always @(posedge CLK) begin
            ra = ra + (A & C);
            rb = B;
end
assign Y =  (S)? ra : rb :
endmodule
```

As an example of the delay constraints 20b, the following conditions are given:

Operational cycle: 50 ns

Input terminal A→clock CLK: 30 ns

Input terminal B→clock CLK: 10 ns

Clock CLK→output Y: 20 ns

When the logic synthesis process S21 is executed according to the function description of circuit specifications 20a and the delay constraints 20b discussed above-mentioned, there is synthesized a circuit which is minimized in area and which is operable at a minimum speed required for satisfying the given delay constraints 20b, and the connection information on the schematic leaf cell level 20d is generated.

Figure 15:
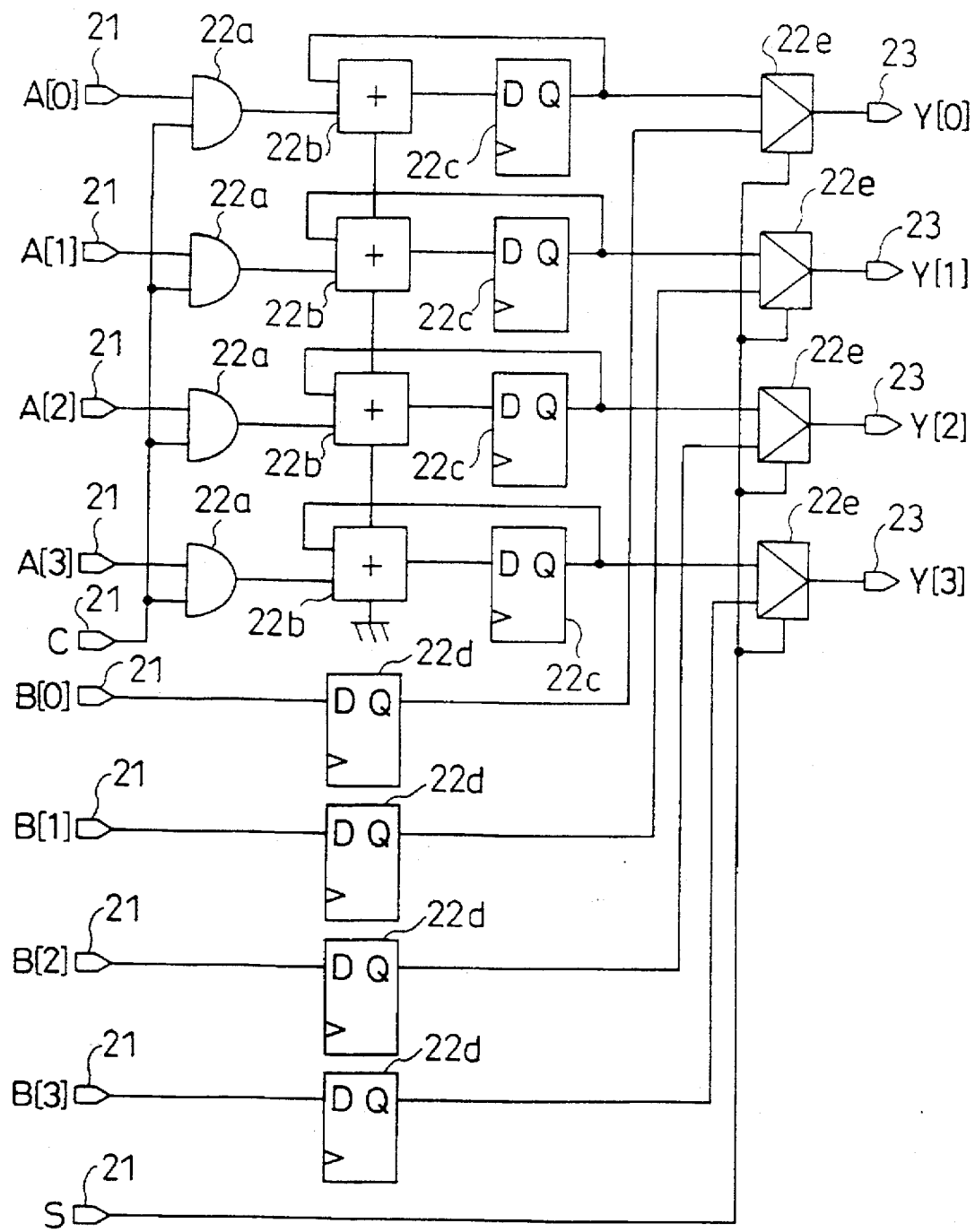
FIG. 15 shows an example of connection information on the schematic leaf cell level.

FIG. 15 shows an example of the connection information on the schematic leaf cell level 20d obtained by the logic synthesis process S21. Shown in FIG. 15 are signal input terminals 21, signal output terminals 23, AND gates 22a, full adders 22b, D flip-flops 22c, 22d, and selectors 22e. These elements have been prepared, as schematic leaf cells, in the schematic leaf cell library 20c. For simplification's sake, clock signal lines to the D flip-flops 22c, 22d are omitted in FIG. 15.

By the regularity extraction process S22, the blocked connection information 20e are generated from the connection information on the schematic leaf cell level 20d.

Figure 16:
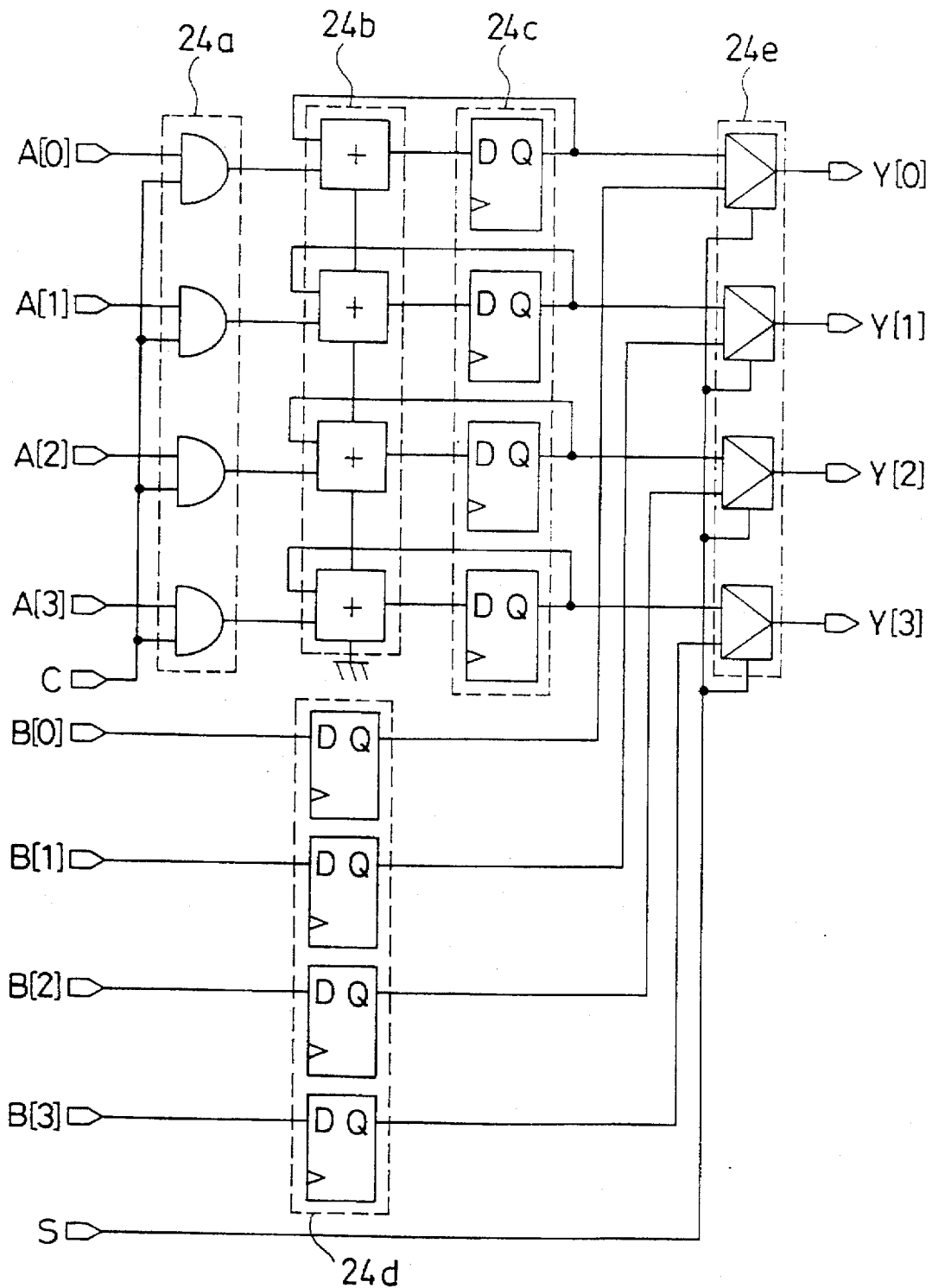
FIG. 16 is an example of connection information prepared in the form of a macro.

FIG. 16 shows the blocked connection information 20e generated from an example of the connection information on the schematic leaf cell level 20d shown in FIG. 14. The AND gates 22a are collected in a single function block 24a. Similarly, the full adders 22b, the D Flip-flops 22c, the D flip-flops 22d and the selectors 22e are collected in function blocks 24b, 24c, 24d, respectively.

Then, the function block placement process S23 determines a placement on the function block level.

FIG. 17 shows the blocked connection information containing placement information 20f obtained after the placement on the function block level has been determined based on the blocked connection information 20e shown in FIG. 15. In FIG. 17, the function blocks are placed in order of 24a, 24b, 24c, 24e, 24d from the left side.

Then, the data path circuit layout data 20i are generated by the detail placement and routing process S26.

Figure 18:
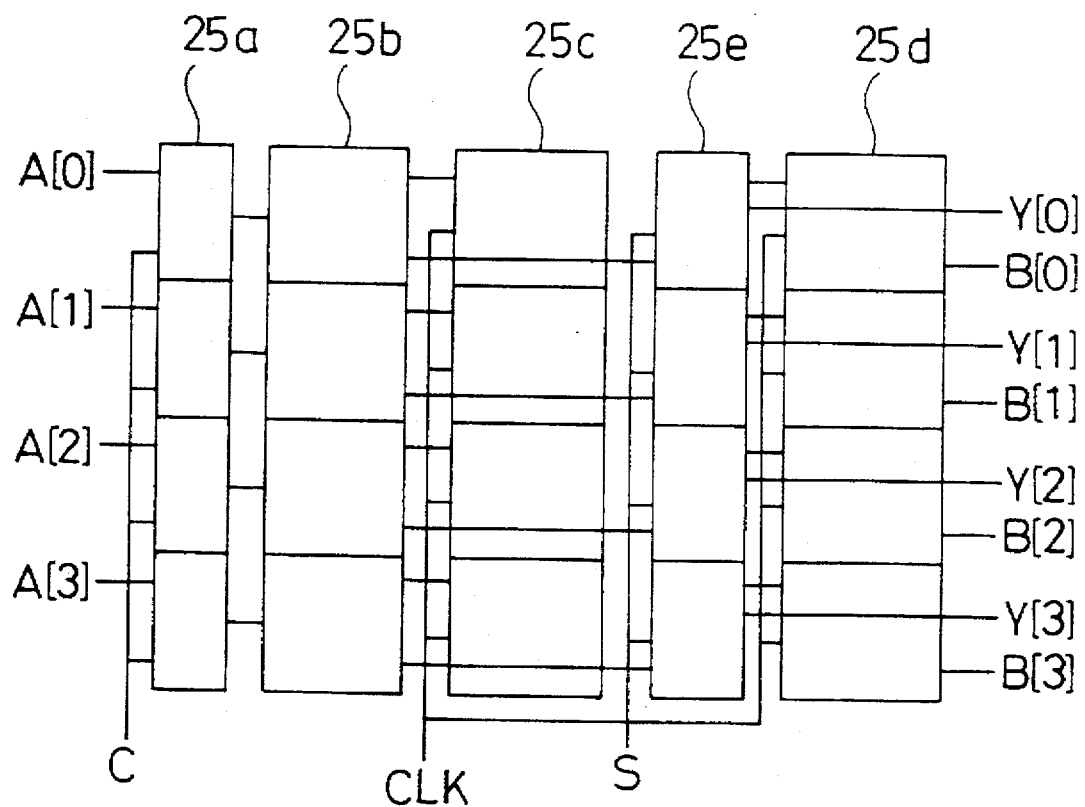
FIG. 18 is an example of layout data.

FIG. 18 shows the layout data 20i generated by the detail placement and routing process S26 based on the blocked connection information containing placement information 20f shown in FIG. 17. Shown in FIG. 18 are a layout leaf cell column 25a forming the function block 24a, a layout leaf cell column 25b forming the function block 24b, a layout leaf cell column 25c forming the function block 24c, a layout leaf cell column 25d forming the function block 24d, and a layout leaf cell column 25e forming the function block 24e. The layout leaf cells forming the function blocks have been prepared in the layout leaf cell library 20h. The layout leaf cells are wired to one another according to the blocked connection information containing placement information 20f.

The foregoing has discussed the basic process flow of the data path circuit layout design method according to the second embodiment. In fact, the basic process are executed with a variety of process added thereto.

First, the drive ability optimization process S24 will be discussed. According to the drive ability optimization process S24, the blocked connection information containing placement information 20f obtained by the function block placement process S23, is evaluated for each signal delay time, and the signal line drive ability of a function block is changed as necessary.

In FIG. 17 for example, when the delay time is 32 ns and the given delay constraints are not greater than 30 ns in the signal line from the external input A to the function block 24c of the D flip-flops, the AND gates of the function block 24a and the full adders of the function block 24b are replaced with those which have the same logic function and of which delay values are smaller or of which driving abilities are greater.

There are also instances where the cell placement improvement process S25 is executed before the detail placement and routing process S26. In such a case, the contents of the process are similar to those discussed in connection with the first embodiment.

As discussed in the foregoing, according to the data path circuit layout design method of the second embodiment of the present invention, there can be generated, for a data path circuit of which specifications are described in a function description language, a mask layout which securely satisfies the timing specifications, which is reduced in circuit area and which satisfies the circuit block contour conditions.

Figure 19:
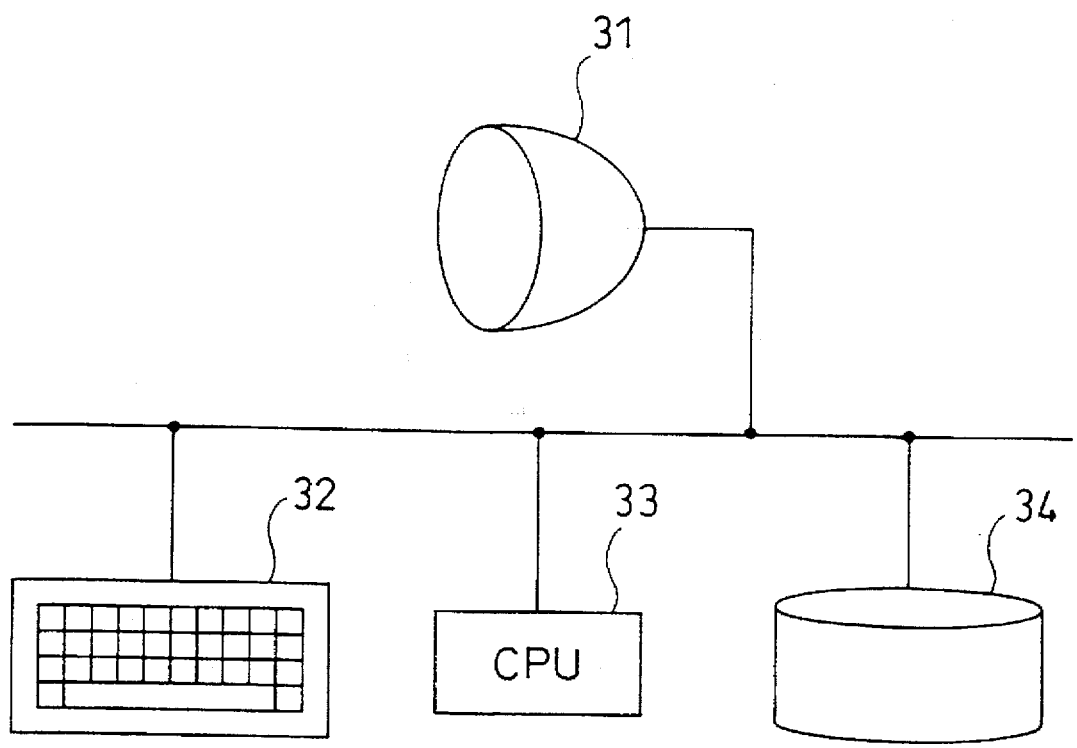
FIG. 19 is a view illustrating the arrangement of hardware for achieving the data path circuit layout design method according to the present invention.

In addition, the present invention can be embodied by a hardware arrangement shown in FIG. 19 in which there are disposed a display device 31, an input keyboard 32, a central process unit 33, and a memory 34 containing pieces of information.

We claim:

1. A data path circuit layout design method of generating a mask layout of a data path circuit comprising a plurality of function blocks, said data path circuit layout design method characterized in that there are prepared (i) function macros in each of which there is defined an expansion, according to the parameters, to a circuit comprising a plurality of schematic leaf cells and (ii) layout leaf cells corresponding to said schematic leaf cells, and said data path circuit layout design method comprising:

a function macro placement process for determining, for a data path circuit of which function blocks are described by function macros, the placement of said function blocks so as to optimize the value of a predetermined objective function;

a function macro expansion process for expanding each of said function macros describing said function blocks, to a circuit comprising a plurality of schematic leaf cells and for preparing connection information on the schematic leaf cell level; and a detail placement and routing process for generating a mask layout by replacing said schematic leaf cells with the corresponding layout leaf cells and for wiring said layout leaf cells to one another, said replacing and said wiring being made based on said placement of said function blocks determined by said function macro placement process and on said connection information on the schematic leaf cell level prepared by said function macro expansion process.

2. A data path circuit layout design method according to claim 1, wherein signal delay constraints are given to each signal line between function blocks, and said objective function in said function macro placement process has a term representing information of deviation from said signal delay constraints.

3. A data path circuit layout design method according to claim 2, wherein each of said function macros has a parameter which specifies the circuit output drive ability, and said method further comprising, after said function macro placement process, a drive ability optimization process arranged such that the signal delay time of each signal line between function blocks is obtained, and that when there is a signal line which does not satisfy the signal delay constraints, there is changed the output drive ability specifying parameter of the function macro which describes the function block at the output side of said signal line, such that said signal delay constraints are satisfied.

4. A data path circuit layout design method according to claim 2, wherein said function macro expansion process has a process for changing the output drive ability of the schematic leaf cell for driving a plurality of schematic leaf cells in each of said function blocks such that said signal delay constraints are satisfied.

5. A data path circuit layout design method according to claim 1, wherein:

data path circuit contour conditions are given; and said objective function in said function macro placement process has a term representing the degree of satisfaction with respect to said contour conditions.

6. A data path circuit layout design method according to claim 5, wherein:

a plurality of layout leaf cells respectively having different outer shapes are prepared for each of said schematic leaf cells;

said function macro expansion process has a process for selecting a layout leaf cell for each of said schematic leaf cells such that said contour conditions are satisfied; and said detail placement and routing process has a process for replacing said schematic leaf cells with said layout leaf cells selected in said function macro expansion process.

7. A data path circuit layout design method according to claim 5, further comprising, after said function macro expansion process, a cell placement improvement process for exchanging the placement of said schematic leaf cells such that the value of said predetermined objective function is optimized.

8. A data path circuit layout design method according to claim 5, wherein said function macro placement process has a process for placing a plurality of function blocks in line in the data signal transmitting direction and for placing a plurality of adjacent function blocks in each column in the direction at a right angle to said data signal transmitting direction.

9. A data path circuit layout design method according to claim 5, further comprising, after said function macro expansion process, a cell regeneration process for generating layout leaf cells having such shapes as to satisfy said contour conditions, based on said connection information on the schematic leaf cell level prepared in said function macro expansion process.

10. A data path circuit layout design method according to claim 1, wherein said objective function in said function macro placement process has a term representing the number of wiring lines, out of the wiring lines passing through each of said function blocks, which cannot pass through the routing track, a term representing the total wiring length of the signal lines connecting said function blocks to one another, and a term representing information of deviation from delay constraints of each of said signal lines.

11. A data path circuit layout design method of generating a mask layout of a data path circuit of which specifications are described in a function description language, said data path circuit layout design method characterized in that there are prepared a plurality of schematic leaf cells and layout leaf cells corresponding to said schematic leaf cells, said data path circuit layout design method comprising:

a logic synthesis process for generating a circuit comprising schematic leaf cells by logic synthesis and for preparing connection information on the schematic leaf cell level, said generation and preparation being made based on said specifications described in said function description language;

a regularity extraction process for collecting, in said circuit comprising schematic leaf cells generated by said logic synthesis process, a plurality of schematic leaf cells having a common nature, into one function block such that there is generated a circuit comprising a plurality of such function blocks;

a function block placement process for determining, in said circuit comprising a plurality of function blocks generated by said regularity extraction process, the placement of said function blocks such that the value of a predetermined objective function is optimized; and a detail placement and routing process for generating a mask layout by replacing said schematic leaf cells with the corresponding layout leaf cells and by wiring said layout leaf cells to one another, said replacing and said wiring being made based on said connection information on the schematic leaf cell level prepared by said logic synthesis process and on said function block placement determined by said function block placement process.

12. A data path circuit layout design method according to claim 11, wherein signal delay constraints are given, and said objective function in said function block placement process has a term representing information of deviation from said signal delay constraints.

13. A data path circuit layout design method according to claim 12, further comprising, after said function block placement process, a drive ability optimization process arranged such that the signal delay time of each signal line between function blocks is obtained, and that when there is a signal line which does not satisfy said signal delay constraints, there is changed the output drive ability of the schematic leaf cells in the function block at the output side of said signal line such that said signal delay constraints are satisfied.

14. A data path circuit layout design method according to claim 12, further comprising, after said function block placement process, a drive ability optimization process for changing the schematic leaf cell output drive ability for driving a plurality of schematic leaf cells in each of said function blocks such that said signal delay constraints are satisfied.

15. A data path circuit layout design method according to claim 11, wherein:

data path circuit contour conditions are given; and said objective function in said function block placement process has a term representing the degree of satisfaction with respect to said contour conditions.

16. A data path circuit layout design method according to claim 15, further comprising, before said detail placement and routing process, a cell placement improvement process for exchanging the placement of said schematic leaf cells such that the value of said predetermined objective function is optimized.

17. A data path circuit layout design method according to claim 15, wherein said function block placement process has a process for placing a plurality of function blocks in line in the data signal transmitting direction and for placing a plurality of adjacent function blocks in each column in the direction at a right angle to said data signal transmitting direction.

18. A data path circuit layout design apparatus for generating a mask layout of a data path circuit comprising a plurality of function blocks, comprising:

memory means which stores pieces of information relating to (i) function macros in each of which there is defined an expansion, according to the parameters, to a circuit comprising a plurality of schematic leaf cells and (ii) layout leaf cells corresponding to said schematic leaf cells;

input means for entering the design information of a data path circuit of which function blocks are described by function macros;

a central process unit for executing (i) a function macro placement process for determining, based on said data path circuit design information entered by said input means, the placement of said function blocks such that the value of a predetermined objective function is optimized, (ii) a function macro expansion process for expanding, with the use of information stored in said memory means, each of said function macros describing said function blocks to a circuit comprising a plurality of schematic leaf cells, and for preparing connection information on the schematic leaf cell level, and (iii) a detail placement and routing process for generating a mask layout by replacing, with the use of information stored in said memory means, said schematic leaf cells with the corresponding layout leaf cells and by wiring said layout leaf cells to one another, said replacing and said wiring being made based on said function block placement determined by said function macro placement process and on said connection information on the schematic leaf cell level prepared by said function macro expansion process; and output means for supplying said mask layout generated by said detail placement and routing process.

19. A data path circuit layout design apparatus for generating a mask layout of a data path circuit of which specifications are described in a function description language, comprising:

memory means which stores pieces of information relating to (i) a plurality of schematic leaf cells and (ii) layout leaf cells corresponding to said schematic leaf cells;

input means for entering data path circuit specification described in a description language;

a central process unit for executing (i) a logic synthesis process for generating a circuit comprising schematic leaf cells by logic synthesis and for preparing connection information on the schematic leaf cell level, said generation and said preparation being made with the use of information stored in said memory means based on said data path circuit specifications entered by said input means, (ii) a regularity extraction process for collecting, in said circuit comprising schematic leaf cells generated by said logic synthesis process, a plurality of schematic leaf cells having a common nature, into one function block such that there is generated a circuit comprising a plurality of such function blocks, (iii) a function block placement process for determining, in said circuit comprising a plurality of function blocks generated by said regularity extraction process, the placement of said function blocks such that the value of a predetermined objective function is optimized; and (iv) a detail placement and routing process for generating a mask layout by replacing said schematic leaf cells with the corresponding layout leaf cells with the use of information stored in said memory means and by wiring said layout leaf cells to one another, said replacing and said wiring being made based on said connection information on the schematic leaf cell level prepared by said logic synthesis process and on said function block placement determined by said function block placement process; and output means for supplying said mask layout generated by said detail placement and routing process.

20. A memory medium for causing a computer to execute a data path circuit layout design for generating a mask layout of a data path circuit comprising a plurality of function blocks, said memory medium storing:

(i) function macros in each of which there is defined an expansion, according to the parameters, to a circuit comprising a plurality of schematic leaf cells and (ii) layout leaf cells corresponding to said schematic leaf cells; and a program for causing a computer to execute, a function macro placement process for determining, for a data path circuit of which function blocks are described by function macros, the placement of said function blocks so as to optimize the value of a predetermined objective function, a function macro expansion process for expanding each of said function macros describing said function blocks, to a circuit comprising a plurality of schematic leaf cells and for preparing connection information on the schematic leaf cell level, and a detail placement and routing process for generating a mask layout by replacing said schematic leaf cells with the corresponding layout leaf cells and by wiring said layout leaf cells to one another, said replacing and said wiring being made based on said function block placement determined by said function macro placement process and on said connection information on the schematic leaf cell level prepared by said function macro expansion process.

21. A memory medium for causing a computer to execute a data path circuit layout design for generating a mask layout of a data path circuit of which specifications are described in a function description language, said memory medium storing:

a plurality of schematic leaf cells and layout leaf cells corresponding to said schematic leaf cells; and a program for causing a computer to execute, a logic synthesis process for generating a circuit comprising schematic leaf cells by logic synthesis and for preparing connection information on the schematic leaf cell level, said generation and said preparation being made based on specifications described in a function description language, a regularity extraction process for collecting, in said circuit comprising schematic leaf cells generated by said logic synthesis process, a plurality of schematic leaf cells having a common nature, into one function block such that there is generated a circuit comprising a plurality of such function blocks, a function block placement process for determining, in said circuit comprising a plurality of function blocks generated by said regularity extraction process, the placement of said function blocks such that the value of a predetermined objective function is optimized, and a detail placement and routing process for generating a mask layout by replacing said schematic leaf cells with the corresponding layout leaf cells and by wiring said layout leaf cells to one another, said replacing and said wiring being made based on said connection information on the schematic leaf cell level prepared by said logic synthesis process and on said function block placement determined by said function block placement process.

* * * * *